United States Patent
Kim et al.

(10) Patent No.: US 11,631,616 B2
(45) Date of Patent: Apr. 18, 2023

(54) SEMICONDUCTOR AND METHOD OF FABRICATING THE SAME

(71) Applicant: Key Foundry Co., Ltd., Cheongju-si (KR)

(72) Inventors: Young Bae Kim, Cheongju-si (KR); Kwang Il Kim, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 8 days.

(21) Appl. No.: 17/370,284

(22) Filed: Jul. 8, 2021

(65) Prior Publication Data

US 2021/0343598 A1 Nov. 4, 2021

Related U.S. Application Data

(60) Division of application No. 16/654,386, filed on Oct. 16, 2019, now Pat. No. 11,088,031, which is a (Continued)

(30) Foreign Application Priority Data

Nov. 19, 2014 (KR) ........................ 10-2014-0161750

(51) Int. Cl.
*H01L 21/8234* (2006.01)
*H01L 29/78* (2006.01)
(Continued)

(52) U.S. Cl.
CPC .... *H01L 21/823493* (2013.01); *H01L 21/266* (2013.01); *H01L 21/26513* (2013.01);
(Continued)

(58) Field of Classification Search
CPC ....... H01L 21/823493; H01L 21/26513; H01L 21/266; H01L 21/823418; H01L 27/088;
(Continued)

(56) References Cited

U.S. PATENT DOCUMENTS 6,093,620 A 7/2000 Peltzer
6,740,952 B2 5/2004 Fujishima et al.
(Continued)

FOREIGN PATENT DOCUMENTS

JP 2002-270830 A 9/2002
JP 5321840 10/2013
(Continued)

OTHER PUBLICATIONS

Korean Office Action dated Feb. 13, 2018 in counterpart Korean Patent Application No. 10-2014-0161750 (6 pages in Korean).
(Continued)

*Primary Examiner* — Cuong B Nguyen
(74) *Attorney, Agent, or Firm* — NSIP Law

(57) ABSTRACT

Provided are a semiconductor device, a method of manufacturing the same, and a method of forming a uniform doping concentration of each semiconductor device when manufacturing a plurality of semiconductor devices. When a concentration balance is disrupted due to an increase in doping region size, doping concentration is still controllable by using ion blocking patterns to provide a semiconductor device with uniform doping concentration and a higher breakdown voltage obtainable as a result of such doping.

18 Claims, 26 Drawing Sheets

Related U.S. Application Data continuation-in-part of application No. 15/371,502, filed on Dec. 7, 2016, now Pat. No. 10,490,456, which is a division of application No. 14/719,738, filed on May 22, 2015, now Pat. No. 9,548,203.

(51) Int. Cl.

| | | |
|---|---|---|
| *H01L 29/66* | (2006.01) | |
| *H01L 29/08* | (2006.01) | |
| *H01L 27/088* | (2006.01) | |
| *H01L 21/265* | (2006.01) | |
| *H01L 29/06* | (2006.01) | |
| *H01L 29/10* | (2006.01) | |
| *H01L 21/266* | (2006.01) | |

(52) U.S. Cl.
CPC .... *H01L 21/823418* (2013.01); *H01L 27/088* (2013.01); *H01L 29/0634* (2013.01); *H01L 29/0878* (2013.01); *H01L 29/0882* (2013.01); *H01L 29/0886* (2013.01); *H01L 29/1083* (2013.01); *H01L 29/1095* (2013.01); *H01L 29/66659* (2013.01); *H01L 29/66681* (2013.01); *H01L 29/7816* (2013.01); *H01L 29/7835* (2013.01); *H01L 29/063* (2013.01)

(58) Field of Classification Search
CPC ............. H01L 29/0634; H01L 29/0878; H01L 29/0882; H01L 29/0886; H01L 29/1083; H01L 29/1095; H01L 29/66659; H01L 29/66681; H01L 29/7816; H01L 29/7835; H01L 29/063; H01L 21/2253; H01L 29/0619; H01L 29/0623; H01L 29/1045; H01L 29/41758; H01L 29/42368
See application file for complete search history.

(56) References Cited

U.S. PATENT DOCUMENTS

| | | | |
|---|---|---|---|
| 6,794,719 B2 | 9/2004 | Petruzzello et al. | |
| 6,903,421 B1 | 6/2005 | Huang et al. | |
| 7,705,399 B2 | 4/2010 | Tanaka et al. | |
| 8,592,901 B1* | 11/2013 | Sheu .................. | H01L 29/0634 |
| | | | 257/E29.007 |
| 2004/0251493 A1 | 12/2004 | Kitaguchi | |
| 2005/0253201 A1 | 11/2005 | Inoue et al. | |
| 2006/0027863 A1* | 2/2006 | Kumagai ............ | H01L 29/0886 |
| | | | 257/E29.133 |
| 2006/0038225 A1 | 2/2006 | Lotfi et al. | |
| 2008/0006875 A1 | 1/2008 | Ohtsuka et al. | |
| 2014/0070311 A1 | 3/2014 | Yang et al. | |
| 2019/0334001 A1 | 10/2019 | Mori | |

FOREIGN PATENT DOCUMENTS

| | | |
|---|---|---|
| JP | 2017-152559 A | 8/2017 |
| KR | 2007-0088376 A | 8/2007 |
| KR | 10-0904783 B1 | 6/2009 |

OTHER PUBLICATIONS

Korean Office Action dated Dec. 21, 2020 in counterpart Korean Patent Application No. 10-2019-0149402 (5 pages in Korean).

\* cited by examiner

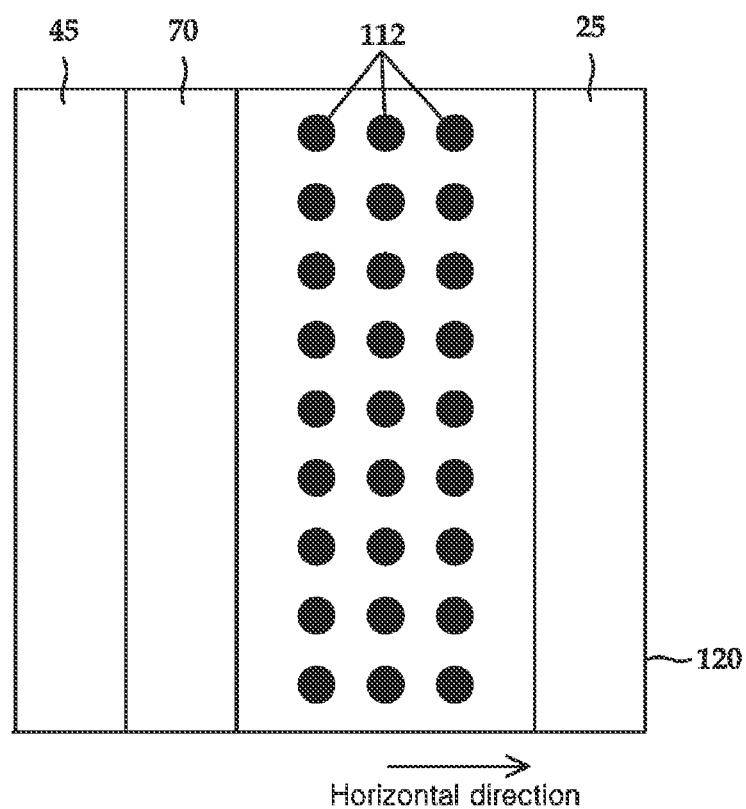

SEMICONDUCTOR AND METHOD OF FABRICATING THE SAME

CROSS-REFERENCE TO RELATED APPLICATION(S)

This application is a division of application Ser. No. 16/654,386, filed on Oct. 16, 2019, which is a continuation-in-part of application Ser. No. 15/371,502, filed on Dec. 7, 2016, now U.S. Pat. No. 10,490,456 B2 issued on Nov. 26, 2019 which is a division of application Ser. No. 14/719,738 filed on May 22, 2015, now U.S. Pat. No. 9,548,203 issued on Jan. 17, 2017, which claims the benefit under 35 USC 119(a) of Korean Patent Application No. 10-2014-0161750 filed on Nov. 19, 2014 in the Korean Intellectual Property Office, the entire disclosure of which is incorporated herein by reference for all purposes.

BACKGROUND

1. Field

The following description relates to a semiconductor device and a method for manufacturing the semiconductor device. The following description further relates to a semiconductor and a method of fabricating the same, wherein the semiconductor is configured so as to obtain an even and high breakdown voltage.

2. Description of Related Art

In an example of a N-type Lateral Double diffused Metal-Oxide-Semiconductor (LDMOS), a body region that includes a source region is connected to a ground power and, a breakdown voltage is limited from a high concentration N-type (N+) source region to a body region.

Various approaches have been suggested to address concerns related to a low breakdown voltage of said LDMOS element. For example, approaches have been suggested such as a deep well that is extended and situated from a drain region to a P-type body region, so as to surround the P-type body region, such that the surrounding source region forms a low concentration N-type diffusion region wherein such a region is situated to surround a high concentration N-type source region. Although it is possible to improve a breakdown voltage above a certain level to some extent through said methods, a breakdown voltage of over approximately 100 V for such an LDMOS has not been obtainable.

Furthermore, a method of fully isolating a P-type body region from a substrate by forming an N-type high concentration N+ buried layer between the substrate and a deep well region and forming a thick epi-layer on a substrate has been suggested. However, such a technology that uses such an approach to configure a buried layer and thick epi-layer has not only a problem of requiring a high unit cost, but also many applications that are not compatible with such an approach of fully isolating the P-type body region exist.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples overcome the above disadvantages and other disadvantages not described above. Also, the examples are not required to overcome the disadvantages described above, and an example potentially does not overcome any of the problems described above.

The examples provide a semiconductor and method of fabricating the same which can have a higher breakdown voltage than alternatives.

The examples provide a semiconductor and method of fabricating the same with a higher breakdown voltage than alternatives. The examples also provide the possibility of manufacturing a semiconductor device with a lower cost of manufacturing said semiconductor device.

Furthermore, the examples provide a semiconductor and method of fabricating the same which improves stability of a breakdown voltage in regards to reduced surface field (RESURF) structure of a semiconductor device. The RESURF concept gives the best trade-off between the breakdown voltage and the on-resistance of a device.

According to one general aspect, a semiconductor device includes a first region and a second region located on a substrate, a first semiconductor device located in the first region and having a first deep well region with a first doping concentration, a second semiconductor device located in the second region and having a second deep well region with a second doping concentration that is greater than the first doping concentration, a first body region of a first conductivity type having a third doping concentration, adjacent to the first deep well region, and a second body region of a second conductivity type opposite to the first conductivity type located in the first body region, wherein the first deep well region has a non-planar doping profile in a horizontal direction.

The first deep well region may have an uneven bottom surface.

A total doping concentration of the first deep well region and the first body region may be substantially balanced with a total doping concentration of the second deep well region.

The first doping concentration may be less than the second doping concentration by within one order of magnitude.

The first deep well region may have a non-planar shape of a doping profile in a horizontal direction.

The semiconductor device may further include a pinch-off region in the semiconductor substrate located between the first deep well region and the first body region.

The first doping concentration may be less than the third doping concentration.

The first deep well region may have substantially the same depth as the first body region.

In another general aspect, a method for fabricating a semiconductor includes forming a first region and a second region on a substrate, forming a first semiconductor device located in the first region and having a first deep well region of a first doping concentration, forming a second semiconductor device located in the second region and having a second deep well region of a second doping concentration that is greater than the first doping concentration, forming a first body region of a first conductivity type having a third doping concentration, adjacent to the first deep well region, and forming a second body region of second conductivity type opposite to the first conductivity type located in the first body region, wherein the first deep well region, the first body region and the second deep well region are formed in the same process, and wherein the first deep well region is formed using a mask pattern that blocks ion injection.

The mask pattern may include stripe patterns.

The first deep well region may have a bottom surface that has a wave-shaped pattern.

The wave-shaped pattern may be aligned with a position of the blocking pattern.

The method may further include forming a body region of the second conductivity type and a source region of the first conductivity type in the first body region, forming a drain region of the first conductivity type on the first deep well region, forming a gate insulator film over the first body region and the first deep well region, and forming a gate electrode on the gate insulation layer.

In another general aspect, a semiconductor device includes a first deep well region with a first doping concentration of a first semiconductor device located in a first region located on a substrate, a second deep well region with a second doping concentration that is greater than the first doping concentration of a second semiconductor device located in the a second region located on a substrate, a first body region of a first conductivity type with a third doping concentration, adjacent to the first deep well region, and a second body region of a second conductivity type opposite to the first conductivity type located in the first body region, wherein the first deep well region has a non-planar doping profile in a horizontal direction.

The first deep well region may have an uneven bottom surface.

A total doping concentration of the first deep well region and the first body region may be substantially balanced with a total doping concentration of the second deep well region.

The first doping concentration may be less than the second doping concentration by within one order of magnitude.

The semiconductor device may further include a pinch-off region in the semiconductor substrate located between the first deep well region and the first body region.

The first doping concentration may be less than the third doping concentration.

The first deep well region may have substantially the same depth as the first body region.

Other features and aspects will be apparent from the following detailed description, the drawings, and the claims.

BRIEF DESCRIPTION OF THE DRAWINGS

FIGS. 6A to 6E illustrates an example of a mask pattern which is applicable to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
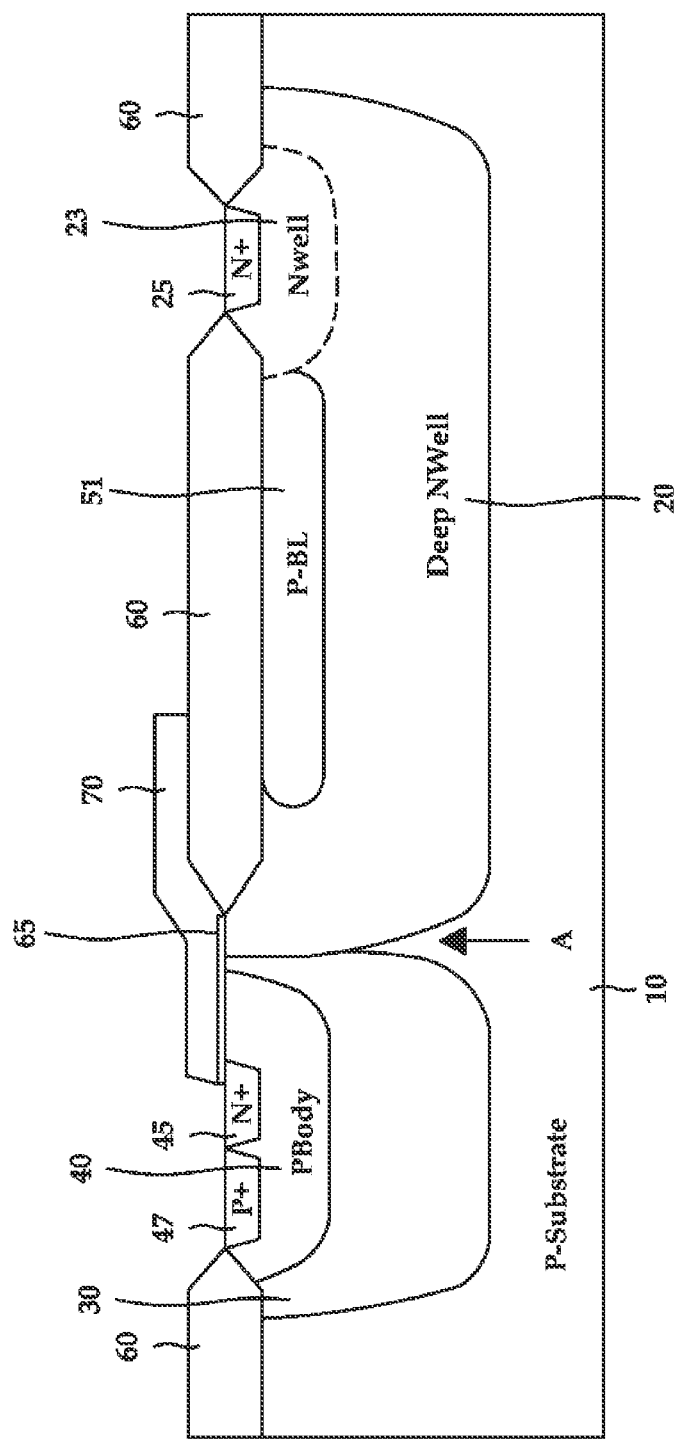
FIG. 1 illustrates a reference semiconductor structure of semiconductor device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Certain examples are now described in greater detail with reference to the accompanying drawings.

In the following description, the same drawing reference numerals are used for the same elements, even in different drawings. The matters defined in the description, such as detailed constructions of terms and elements, are provided to assist in a comprehensive understanding of the present examples. Accordingly, it is apparent that it is possible for the examples to be carried out without those specifically defined matters. Also, well-known functions or constructions are not described in detail to avoid obscuring the examples with unnecessary detail.

While the expressions such as "first" or "second" are potentially used to refer to various elements, the elements are not intended to be limited by the expressions. Such expressions are used only for the purpose of distinguishing one element from the other when referring to such elements.

The expressions presented are used herein only for the purpose of explaining specific examples and are not intended to place limits on the present examples. An expression in singular form also encompasses plural meaning, unless otherwise specified. Throughout the description, the expression "comprise" or "have" is used only to designate the existence of a characteristic, number, step, operation, element, component or a combination thereof which is described herein, but not to preclude possibility of existence of one or more of the other characteristics, numbers, steps, operations, elements, components or combinations of these or other appropriate additions.

Spatial words, such as below, beneath, lower, above and upper are used to conveniently recite a correlation between one element or features with respect to other elements or features, as illustrated in the drawings. When spatial terminology is used with a direction as illustrated in the drawing, if the illustrated element is upside down, the element that was recited as below and beneath is also potentially considered to be above or upper of another element. Thus, examples presented below include all such instances related to the directions of below and above. An element is also potentially aligned in another direction, and thereby spatial words are interpreted according to the alignment.

Moreover, words such as a first conductive type and a second conductive type indicate opposite conductive types like P-type or N-type. An example that is each recited and illustrated herein includes complementary examples thereof, in which P-type dopants are replaced by N-type dopants and vice versa. For example, in an example, a first conductive type is a P-type and a second conductive type is a N-type, but these types are switched in another example.

Before discussing further a semiconductor and method of fabricating the same, explanation regarding reference semiconductor structure of the present invention is presented through a discussion of a detailed illustration in regards to FIG. 1.

FIG. 1 illustrates a reference semiconductor structure regarding semiconductor device and a mask pattern thereof.

As illustrated in the example of FIG. 1, a semiconductor device with a quasi-isolated P-type body region 40 is suggested in regards to the process of developing a technology of manufacturing a semiconductor and method of fabricating the same of the present example.

Specifically, the quasi-isolated semiconductor device which is illustrated in the example of FIG. 1, indicates a semiconductor structure in which an N-type body region 30 is added to electronically isolate a P-type body region 40 from a P-type substrate 10.

Thus, a semiconductor device as illustrated in the example of FIG. 1 includes a P-type substrate 10; an N-type deep well 20 which is formed on the substrate 10, an N+ drain region 25 formed on the N-type deep well 20, an N+ source region 45 and a P+ pickup region 47 which is formed on a substrate, a P-type body region 40 formed so as to surround the N+ source region 45 and P+ pickup region 47, and an N-type body region 30, such as a second semiconductor region, formed at an identical depth with the N-type deep well 20, such as a first semiconductor region, that surrounds the P-type body region 40, wherein the N-type body region 30 is in direct contact with the N-type deep well 20.

In order to form said semiconductor structure as illustrated in the example of FIG. 1, a single open-type mask pattern, not illustrated, is used to form the N-type body region 30 and the N-type deep well 20. Furthermore, according to such an example, an additional N-type drift drain extension region 23 is formed in the N-type deep well 20 and the additional N-type drift drain extension region 23 encloses the N+ drain region 25 of a semiconductor device. Furthermore, in the example of FIG. 1, a P-type buried layer 51 is formed in the N-type deep well 20 and the P-type buried layer 51 is in contact with the N-type drift drain extension region 23.

Additionally, a Local Oxidation of Silicon (LOCOS) isolation region 60 is formed on the N-type deep well 20. Further, a gate insulation layer 65 is formed over the N-type body region 30 and the N-type deep well 20. A gate electrode 70 is formed over the gate insulation layer 65. However, a total N-type dopant concentration of a semiconductor feature increases when compared to a semiconductor device having a non-isolated P-type body region 400, such as presented with reference to FIG. 2. Thereby, a pre-determined N to P dopant concentration balance is potentially broken and the breakdown of such a balance potentially causes a problem of distorting and destabilizing pre-determined a breakdown voltage $BV_{DSS}$ between a source-drain region.

Thus, when an additional well region is added to electronically isolate a region within a substrate, one device potentially has a higher N-type doping concentration than another device. Consequently, such an imbalance of predetermined N:P doping concentrations leads to problems with the control of an optimum $BV_{DSS}$ between source and drain regions of a diode.

Therefore, in an effort to solve said problem of dopant imbalance, a semiconductor and method of fabricating such a semiconductor of the present examples, provides a semiconductor device which is able to maintain a pre-determined high breakdown voltage by controlling total impurity concentration of N-type deep well 20. By controlling the impurity concentration, the semiconductor device avoids the previously discussed problems with respect to breakdown voltage.

Figure 2:
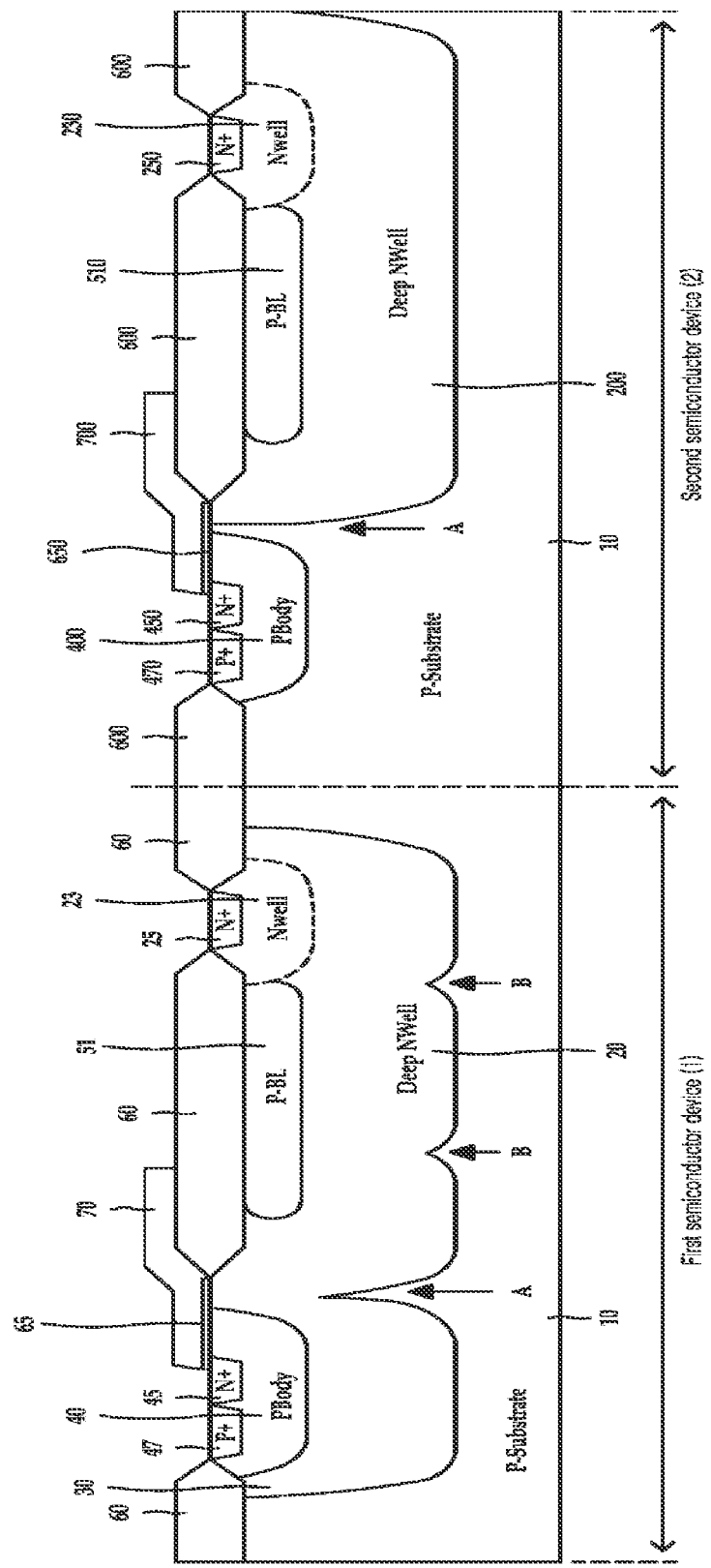
FIG. 2 illustrates an example of an entire semiconductor device applied with a semiconductor device according to an example.

FIG. 2 illustrates an example of a total semiconductor device applied with a semiconductor device according to an example.

Referring to the example of FIG. 2, a semiconductor device according to an example is applied on a P-type substrate 10 as one of a plurality of semiconductor devices. An LDMOS device, which is a lateral Metal-Oxide-Semiconductor Field Effect Transistor (MOSFET) device, is given as an example of a semiconductor device according to the present examples.

Referring to the example of FIG. 2, a plurality of semiconductor device potentially at least includes a first semiconductor device 1 and a second semiconductor device 2. Moreover, the plurality of semiconductor device optionally further includes several active or passive devices spaced apart from a first and a second semiconductor device.

Referring to the example of FIG. 2, a first semiconductor device 1 is a structure with a quasi-isolated body region 40 and, a second semiconductor device 2 is a structure with a non-isolated body region 400.

In the example of FIG. 2, two said semiconductor devices are formed simultaneously when using a semiconductor and method of fabricating the semiconductor according to the present examples.

In the example of FIG. 2, a first and a second semiconductor device 1, 2 only differ in an existence and structure of a N-type body region with respect to how the N-type body region is configured to surround a P-type body region 40, 400 and the rest of the structure is identical. For example, a first semiconductor device 1 includes an N-type deep well 20 on a P-type substrate 10; a gate insulation layer 65; a gate electrode 70, an N+ drain region 25 on the N-type deep well 20, an N+ source region 45 and a P+ pickup region 47, and a P-type body region 20. With respect to the first semiconductor device 1, a P-type body region 40 of the first semiconductor device 1 becomes a channel region of the LDMOS device. Said features identically apply to corresponding elements on a second semiconductor device 2, but different drawing numerals are given to the respective elements of a second semiconductor device 2 for easier explanation.

Moreover, a first semiconductor device 1 potentially further includes a N-type drift drain extension region 23 that is formed in a periphery of the N+ drain region 25. An impurity concentration of the N-type deep well 20 and an impurity concentration of an N-type of the drift drain extension region 23 are potentially different. Additionally, impurity concentration of the N-type drift drain extension region 23 and the N+ drain region 25 are potentially different and for example, an impurity concentration of the N-type drift drain extension region 23 is formed to be lower than the impurity concentration of the N+ drain region 25. Likewise, a breakdown voltage of a semiconductor device is increased by forming an impurity concentration of the N-type drift drain extension region 23 to be lower than that of N+ drain region 25.

Furthermore, in the example of FIG. 2, it is possible for a P-type buried layer 51 to be formed in the N-type deep well 20. The P-type buried layer 51 potentially is in contact with the N-type drift drain extension region 23. In FIG. 2, P-type buried layer 51 is illustrated in the example as being formed below a LOCOS isolation region 60. For example, the P-type buried layer 51 is formed in a certain space isolated from the LOCOS isolation region 60. In response, a structure and operation of a drain region 230 and a P-type buried layer 510, in regards to the second semiconductor device 2 with the non-isolated P-type body region 400, are identical or similar to those of a case of a first semiconductor device 1, and thus, the explanation is omitted for brevity.

In the example of FIG. 2, a first semiconductor device 1 includes an N-type body region 30, such that the N-type body region 30 is in contact with a part of one side of a N-type deep well 20. The N-type body region 30 is configured so as to surround the P-type body region 40. Here, the N-type body region 30 electronically isolates the P-type body region 40 and the source region 45 from the P-type substrate 10. Thus, by use of such an approach, the source region 45 and the P-type substrate 10 are able to maintain a different potential in the first semiconductor device 1.

On the other hand, a second semiconductor device 2 with a non-isolated P-type body region has no such a N-type body region 20, as is present in the first semiconductor device 1.

Likewise, both the first semiconductor device 1 and the second semiconductor device 2 are composed so as to have a very similar structure, and so it is possible to simultaneously manufacture the two semiconductor device through identical mask processes. Thereby, manufacturing costs are reduced by reducing the amount of mask processes that are necessary.

For example, the N-type deep wells 20, 200 and N-type body region 30 for the first semiconductor device 1 with a quasi-isolated P-type body region 40 and the second semiconductor device 2 with a non-isolated body region 400 are all potentially formed in one N-type deep well mask, as is illustrated with reference to FIG. 3 at 110. Thus, a bottom depth of the N-type deep wells 20, 200 and a bottom depth of the N-type body region 30 are almost identical. These depths are the same because the N-type deep wells 20, 200 and the N-type body region 30 are formed by using an identical N-type deep well mask 110.

However, a first semiconductor device 1 has a higher N-type dopant concentration than a second semiconductor device 2, since the N-type body region 30 is added, compared to a second semiconductor device 2. In an example, it is assumed that N:P dopant concentration is fixed at 5:1 in a second semiconductor device 2. If there is no reduction of a dopant concentration in the N-type deep well 20, the N:P dopant concentration ratio potentially increases to 7:1 or 8:1 in a first semiconductor device 1. In that case, the increase causes an imbalance in the predetermined N:P dopant concentration ratio which was chosen to set an optimum breakdown voltage $BV_{DSS}$ between source and drain regions.

Thus, the dopant concentration of the N-type deep well 20 is controlled so as to maintain the predetermined N-type and P-type dopant concentration in the active region, which helps to control and regulate the breakdown voltage. Thus, a doping concentration of N-type dopant of the N-type deep well 20 of a first semiconductor device 1 is lowered, because the N-type body region 30 is added in a first semiconductor device. Lowering the N-type dopant concentration in this manner compensates for the added N-type dopant. Thus, based on such a modification, a first semiconductor device 1 and a second semiconductor device 2 have almost the same N-type doping concentration as each other. A sum of N-type concentrations including concentrations for both the N-type deep well 20 and the N-type body region 30 in the first semiconductor device 1 becomes substantially equal to a sum of total N-type concentration of the N-type deep well 200 in the second semiconductor device. Thus, the implanted areas of the N-type deep well 200, the N-type body region 30 and the N-type deep well 20 are controlled to balance the total N-type dopant concentration between first semiconductor device 1 and second semiconductor device 2. By controlling the dopant concentration, it follows that the breakdown voltage is also controlled. For example, a dopant implanted area of the N-type deep well 200 in the second semiconductor device 2 matches with the total implanted area of the N-type body region 30 and the N-type deep well 20 in the first semiconductor device 1. Therefore the N-type dopant concentration balance between the first semiconductor device 1 and the second semiconductor device 2 is obtained using such an approach.

While additional masks are potentially used to form the N-type deep well region 20 of a first semiconductor device as one method to solve the above problems. However, in this case, manufacturing costs increase due to the need for an additional mask process.

Therefore, the examples provide a method of balancing N-type dopant concentration between first semiconductor device 1 and second semiconductor device 2. Furthermore, the examples provide a method of simultaneously forming N-type deep well region 20 and N-type deep well region 200, subject to the need to balance N-type dopant concentration. A mask pattern with a stripe pattern is used to form the first N-type deep well 20 and the second N-type deep well 200 and the N-type body region 30. Likewise, using a mask pattern that includes a plurality of blocking patterns of stripe pattern potentially better controls a balance with respect to N-type dopant concentration between the first semiconductor device 1 and the second semiconductor device 2. To this end, an amount of N-type dopants injected into N-type deep well 20 during manufacturing is controllable. Thus, a ratio of N-type dopant concentration compared to P-type dopant concentration in the semiconductor region is almost the same between the first semiconductor device 1 and the second semiconductor device 2. Hence, the semiconductor region designates the active region including N-type deep well 200, N-type deep well 20, N-type body region 30. Therefore, using such a technique, a high $BV_{DSS}$ is obtained due to a preserved N:P dopants ratio. For example, a dopant implanted area of N-type deep well 200 has the same dopant implantation area with respect to N-type deep well 20. In addition, implanted depth of N-type deep well 200 has the same implanted depth with respect to N-type deep well 20.

Thus, an N-type charge quantity for a N-type deep well region 20 corresponding to a surrounding drain region is reduced as much as an N-type charge quantity is increased due to added N-type body region 30 in a first semiconductor device 1. Accordingly, a ratio of N-type relative to P-type charge quantity is stably maintained as a whole. Thereby, an improvement in breakdown voltage and stably securing breakdown voltage is achieved.

Furthermore, a breakdown voltage value is also increased in a reverse-biased state between an N-type drain region 25 and an N-type source region 45. Thus, a first semiconductor device 1 according to an example, a doping concentration per unit area of N-type deep well 20 is formed to be lower than a doping concentration per unit area of N-type body region 30. This lower doping concentration is achieved because a mask pattern with a plurality of blocking pattern formed with a stripe pattern is used in the formation of a N-type deep well region 20 in the manufacturing process of a semiconductor device.

Moreover, as shown in FIG. 2, a bottom of the N-type deep well 20 is somewhat curved or is formed in a valley shape. Thus, a bottom of the N-type deep well 20 is not formed to have a flat shape but instead is formed at constant spacing in a curved shape. Regional limits of ion injection exist in a mask pattern and are applied on N-type deep well 20. Thereby, a bottom of the N-type deep well 20 is formed at a spacing with a plurality of wells and one groove is formed on the bottom or can be formed in a wave shape with a plurality of grooves B. Additional illustration regarding this subject matter is recited in detail through reference to FIG. 3.

Figure 3:
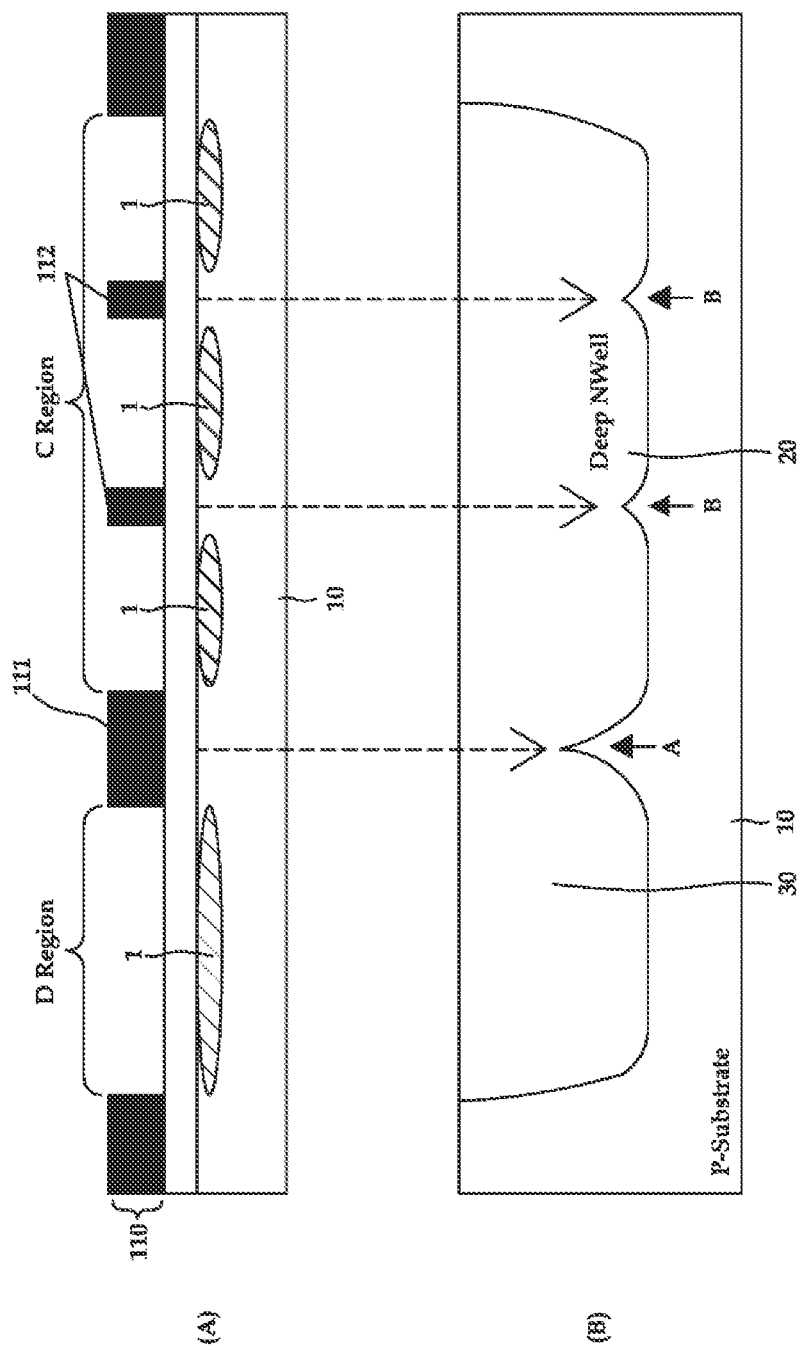
FIG. 3 illustrates a semiconductor and method of manufacturing the same according to an example.
Figure 4:
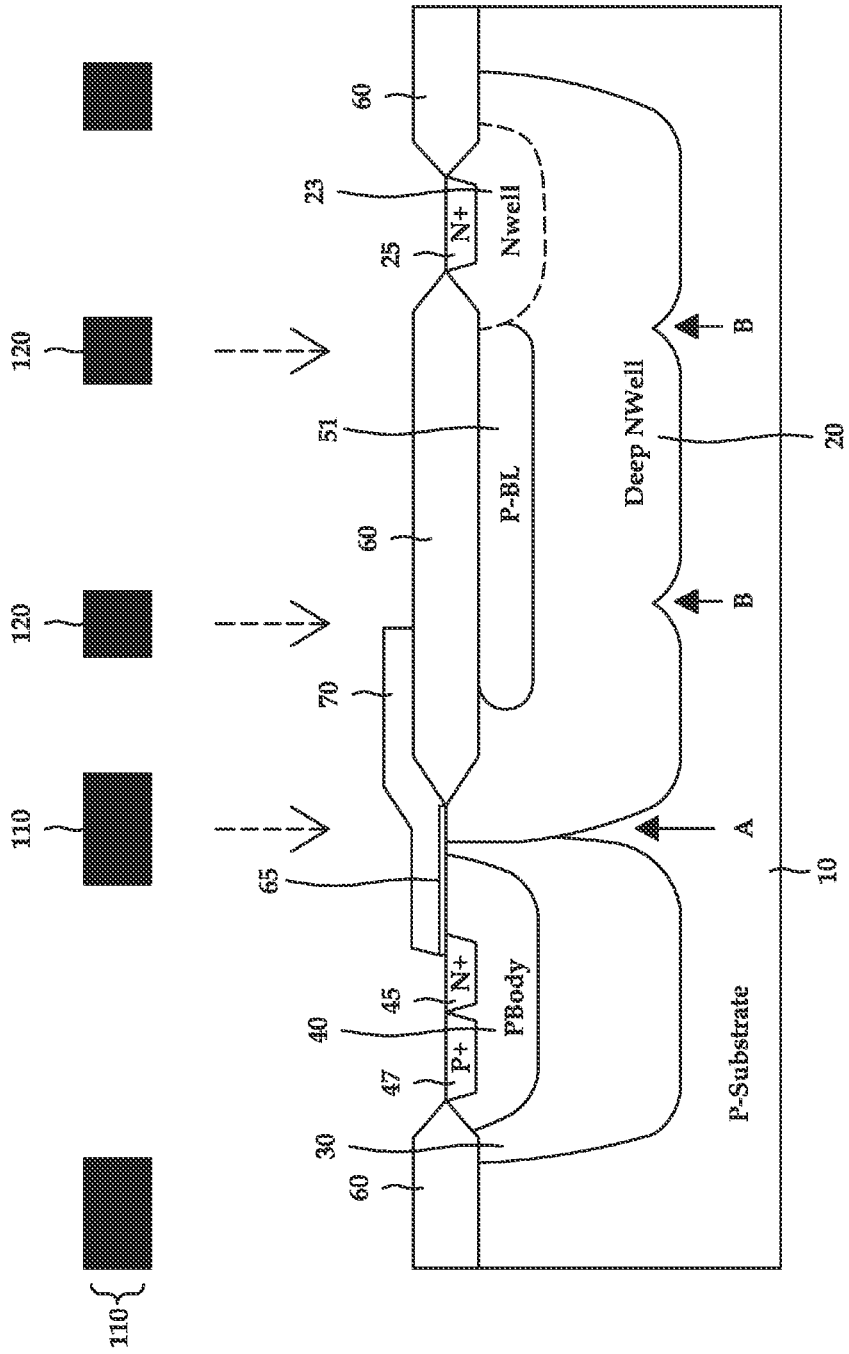
FIG. 4 illustrates a semiconductor device which is manufactured according to an example.
Figure 5:
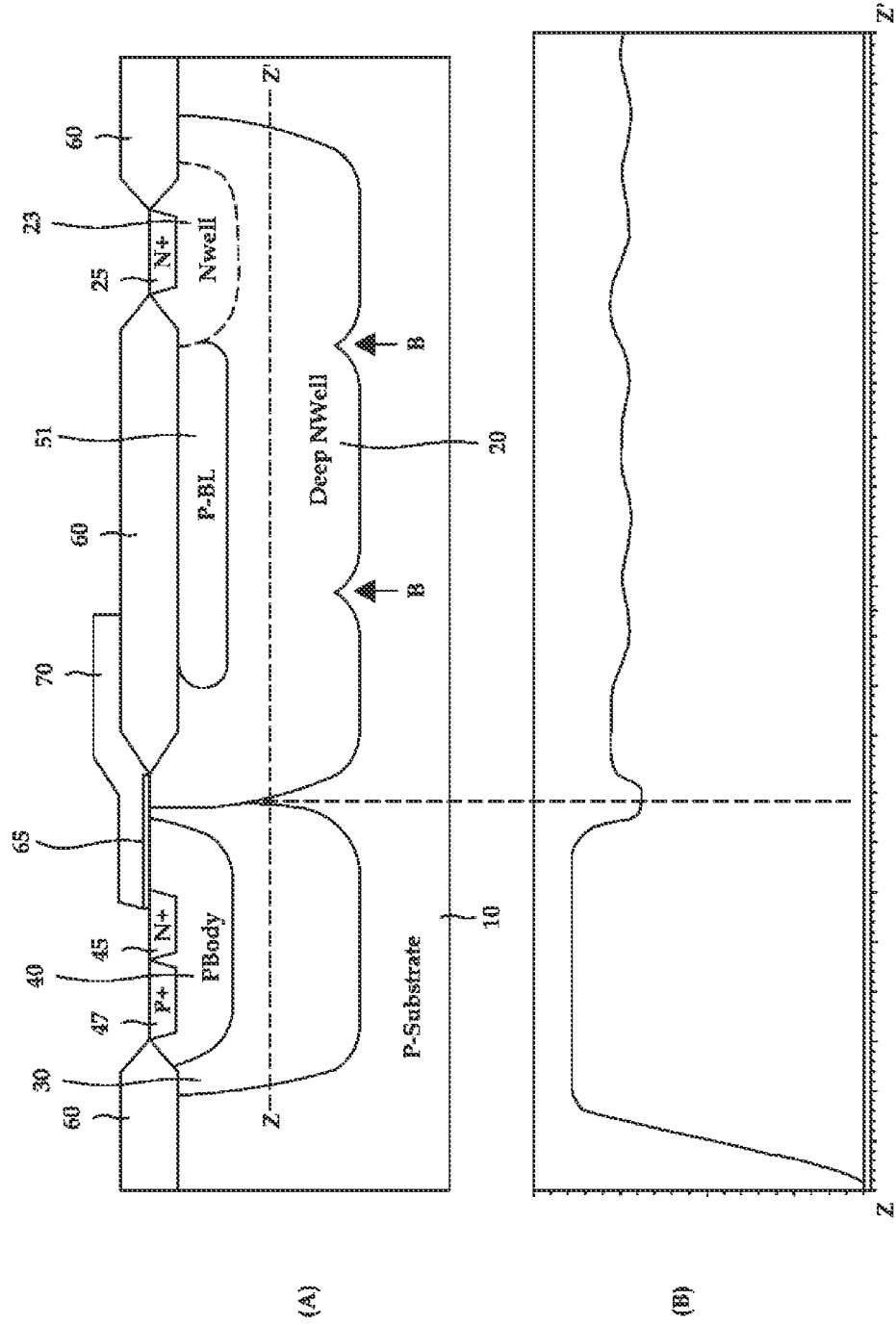
FIG. 5 illustrates a concentration profile of A-A' in the semiconductor device according to an example.

FIG. 3 is a diagram, illustrating a semiconductor and method of manufacturing the same according to an example and FIG. 4 is a diagram, illustrating a semiconductor device that is manufactured according to an example, and FIG. 5 illustrates concentration profile A-A' in the semiconductor device of such an example.

Herein, FIG. 3 illustrates an example of N-type deep well 20, 200 and N-type body region 30 of a semiconductor device according to the present invention formed through mask process. For better understanding, a mask pattern 110 that is applied for a first semiconductor device is illustrated first in FIG. 3.

In the example of FIG. 3, the N-type deep well 20 and the N-type body region 30 are formed together through a mask process that uses a deep well mask pattern 110 on a P-type substrate 10 as illustrated in FIG. 3 at (A) and (B). The deep well mask pattern 110 indicates positions of Photo Resist (PR). In such an example, the mask pattern 110 includes a first stripe pattern 111 and a second stripe pattern 112, such that the first stripe pattern 111 is located so as to differentiate the N-type deep well region 20 from the N-type body region 30.

In the example of FIG. 3, a first stripe pattern 111 is formed with a greater width than the second stripe pattern 112. A first stripe pattern 111 is a pattern that divides the N-type body region 30 and the N-type deep well region 20. As illustrated in FIG. 3 at (B), a first stripe pattern 111 is divided in to two regions at point "A". A boundary between a first deep well 20 and the N-type body region 30 becomes ambiguous if a first stripe pattern is not used. By contrast, if a first stripe pattern 111 is used, as shown in the example of FIG. 3, a division is clear and a deep groove in a concave shape is formed at point "A". When such a shape is formed, it helps to form a pinch-off region that acts as a junction gate field-effect transistor (JFET) device. An N-type drift region exists on the upper deep well region 20 that is the accumulation region. The P-type substrate 10 protrudes into the space between the N-type body region 30 and the N-type deep well 20, which results in forming an N-channel JFET region. Therefore, the N-type body region 30 is protected from a situation where the N+ drain region 25 has a high voltage when semiconductor device is activated. This protection occurs because as shown in the example of FIG. 3, a pinch-off region exists at point "A" that is configured to decrease electric field. Accordingly, to achieve this effect, the first strip pattern 111 in the first example is formed with approximately 2-7 μm length of width in an 400-800V semiconductor device.

By contrast, a plurality of second stripe patterns 12 can be formed with a smaller width than a first stripe pattern 111, and are thus formed with approximately 1-3 μm of width. In other words, the second stripe pattern 112 is used with a line/space type stripe pattern of a narrow and long stick shape or dot-matrix type pattern. Thus, the second stripe pattern 112 plays a role of blocking ion implantation. The deep well mask pattern 110 is differentiated by a "C" region that is configured so as to form the N-type deep well region 20 and a "D" region that is configured so as to form the N-type body region 30. In an example, at least one more second stripe patterns 112 is formed in the "C" region. The example of FIG. 3 illustrates a second stripe pattern 12 formed in two or three portions as an example, but the examples are not limited to this particular example and alternatives are possible. For example, the N-type deep well 20 and the N-type body region 30 care simultaneously formed by simultaneously ion injecting phosphorus (P), arsenic (As), and/or antimony (Sb) as dopants. Then, when thermal treatment for diffusion of the ion injected N-type impurities 1 is performed, the N-type deep well 20 is formed in the "C" region and the N-type body region 30 is formed in the "D" region. Due to diffusion of dopants, each diffused region is merged into one region as shown in FIG. 3 at (B).

Likewise, as a stripe pattern is added into a mask pattern 110, the stripe pattern is configured using a PR form. Thus, the region beneath the PR is prevented from ion injection by the PR during ion injection. Thus, the stripe pattern as discussed becomes a blocking pattern that prevents a kind of ion injection. Accordingly, ion injection is not conducted in regions shielded by PR in the case of an ion injection process. Thus, an ion injected N-type impurity 3 is respectively formed in isolation as illustrated in FIG. 3 at (A).

However, a respective N-type impurity 3 is diffused and comprises one deep well region 20 as shown FIG. 3 at (B) through a thermal or annealing treatment. In this process, the N-type impurity 3 is diffused in both directions with regions not ion injected of the N-type impurity 3. The amount of impurity amount diffused herein, differs according to annealing temperature and time that are used in follow-up thermal treatment process. Ultimately, a concentration of N-type ion, corresponding to charge quantity, per unit area of N-type deep well region 20 is smaller than that of deep well region 200 in the second semiconductor device 2. This relationship holds because the stripe pattern is not used for forming the deep well region 200 in the second semiconductor device 2. Thus, total N-type charge quantity is controlled by using the plurality of stripe pattern 112. Likewise, if a blocking pattern like stripe pattern 112 is added on a "D" region, a total N-type charge quantity or dopant concentration in the N-type deep well 20 is reduced. In the present example, however, there is no use of the stripe pattern in the "D" region.

By using a mask pattern 110 with at least two regions of a second stripe pattern 112 formed on a "C" region for configuration of the N-type deep well 20, ion injection is limited in some region of substrate 10 due to the regions of the second stripe pattern 112. After going through a diffusion process, ion injected impurities are diffused together. Thereby, a single contiguous deep well region 20 is formed and its bottom surface has a wave shape with one or a plurality of grooves "B". In other words, unlike an ion injection process without using stripe patterns as illustrated in the example of FIG. 1, a bottom of N-type deep well 20 has an uneven surface, designated as "B", according to the example. On the contrary, a deep well region 20 formed by an ion injection process that uses a wide opening has a very flat profile, with a coplanar shape on the bottom as shown in the example of FIG. 1.

In the example of FIG. 3, a deep well mask pattern 110 relating to the second semiconductor device is not illustrated in the drawing but is present in certain examples as discussed further, below. The deep well mask pattern 110 which is illustrated in FIG. 3 at (A) is formed with an identical extension to the second semiconductor device 2. Additionally, the stripe pattern 112 that is used in "C" region of the first semiconductor device 1 is not formed in deep well region 200 of the second semiconductor device 2. Furthermore, the N-type body region 30 is not formed in the second semiconductor device 2, unlike as in the first semiconductor device 1.

FIG. 4 is a diagram illustrating a semiconductor device that is manufactured according to an example and a diagram to link with a doping profile of a final semiconductor device according to an example using PR stripe mask pattern 112. As illustrated in the example of FIG. 4, the bottom of the N-type deep well has an uneven surface and its valley, designated "B", is aligned with the position of a stripe pattern 112. This is because ion injection of impurity dopant is limited in a region beneath the pattern 112 due to the presence of the stripe pattern 112 so, unlike other N-type deep well 20, bottom of N-type deep well 20 is recessed a little.

FIG. 5 is a diagram comparing the N-type body region 30 in regards to a Z-Z' line at FIG. 5 at (A) and a concentration profile at FIG. 5 at (B) in regards to the N-type deep well region 20 of a semiconductor device according to the example. As illustrated in FIG. 5 at (B), the N-type body region 30 shows a substantially flat doping profile in a horizontal direction. By contrast, N-type deep well region 20 does not have a constant impurity doping concentration in the horizontal direction, unlike the N-type body region 30, and shows a doping profile of a wave shape that fluctuates within certain sections. This profile occurs because ion injection in certain region of a substrate 10 is interfered with by the stripe pattern 112 as previously mentioned.

Furthermore, a total average concentration that dominates per unit area of the N-type deep well 20 also seems to be lower than the N-type body region 30. This is because, as discussed, certain portions of substrate 10 are not ion injected due to the stripe pattern 112.

A mask pattern for the configuration of the N-type deep well 20 is illustrated in FIG. 6A to FIG. 6E. According to various examples, the mask patterns illustrated in FIG. 6A to 6E are applied with a mask pattern of the N-type deep well region "C" among mask patterns that are configured to simultaneously form the N-type deep well 20 and the N-type body region 30.

FIGS. 6A to 6E are diagrams which illustrate mask patterns which are used in formation of the deep well according to the examples. For easier illustration, the drawing code 120 is used to refer to the entire mask pattern but is also potentially applied on one region of the mask pattern 110 of FIGS. 2 to 4. For an easier understanding of a position of mask pattern arrangement, certain regions of a semiconductor structure, illustrated in FIGS. 2 to 4 are added in a horizontal direction with respect to the substrate surface.

Referring to a top view, in an example, a second stripe pattern 112 is formed in the form of lines, formed evenly spaced apart on a mask pattern 120. In other words, a second stripe pattern 112 is potentially formed in a rectangular form of strips of narrow width, from the perspective of a top view, that are formed to be evenly spaced apart. Thus, in FIGS. 6A to 6E, drawing area 45 indicates source region, drawing area 70 indicates gate electrode and drawing area 25 indicates drain region. Moreover, width X in regards to stripe pattern indicates a minimum distance between a stripe pattern and the next stripe pattern and width Y indicates a width of one stripe pattern. In the examples, width X is to be chosen to be identical or larger than width Y. For example, when width X is 5-15 μm, width Y is 0.5-3 μm, since only when width X is formed larger than width Y, it is possible for the N-type deep well 20 of over a certain size to be formed to have certain properties. Herein, stripe pattern 112 is seen as a mask pattern configured of PR, as discussed above. Said narrow and long stick shaped stripe patterns operate as blocking areas in the ion-injection process discussed above. Also, a concentration of the N-type deep well 20 decreases as width Y becomes larger. Accordingly, by controlling width Y, concentration of dopants in the N-type deep well 20 is controllable. However, if the width Y is configured too large, the diffusion distance becomes limited when ion-injected dopants diffuse, so the diffusion distance is intended to be taken into consideration upon design. In a case of a stripe pattern in which larger width than diffusion distance is formed, an additional deep well 20 such that the deep wells 20 are formed isolated from each other is optionally formed.

Figure 6A:
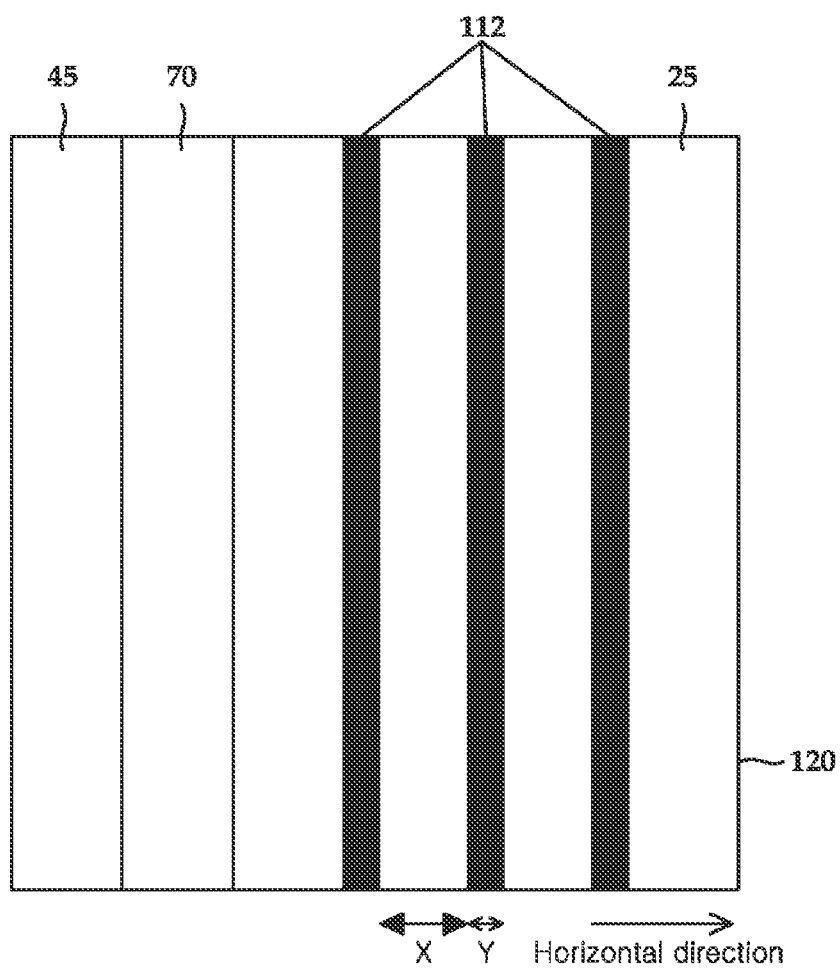
Figure 6B:
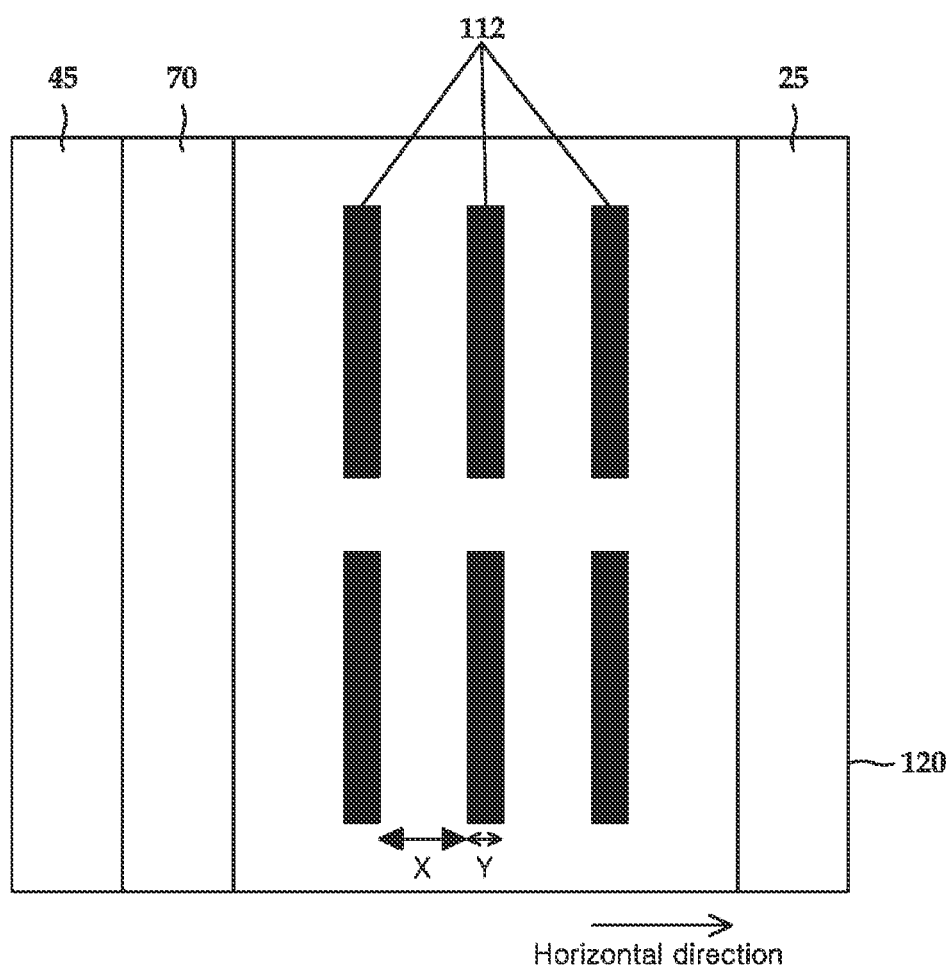

Furthermore, referring to the example of FIG. 6B, in a top view, the second stripe pattern 112 is formed having a shape of a plurality of differentiated lines that are linear stripes in a vertical direction.

Figure 6C:
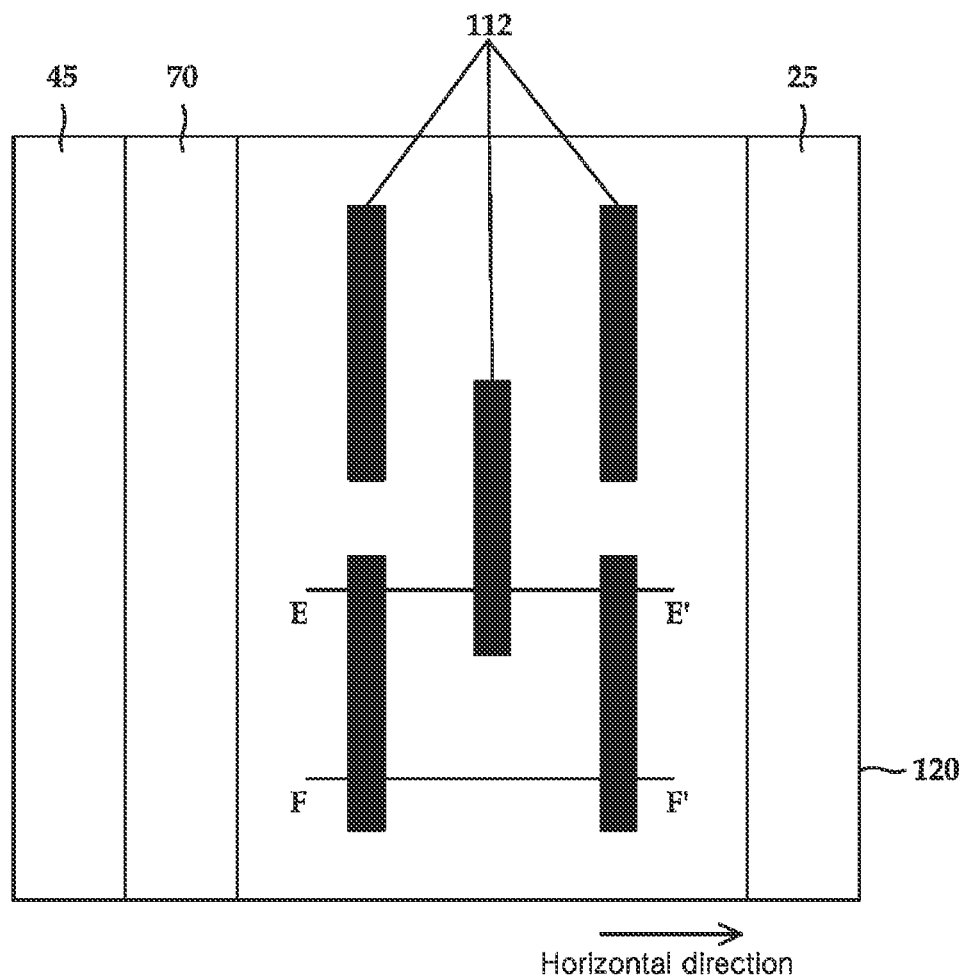

Moreover, as illustrated in FIG. 6C, a second stripe pattern 112 is formed as lines of different patterns, unlike FIG. 6B. In this case, unlike FIG. 6B, with regards to mask pattern 120, a second stripe pattern 112 of three stripes is formed on a first cross section (E-E') while, a second stripe pattern 112 of two stripes is formed on a second cross section (F-F').

Figure 6D:
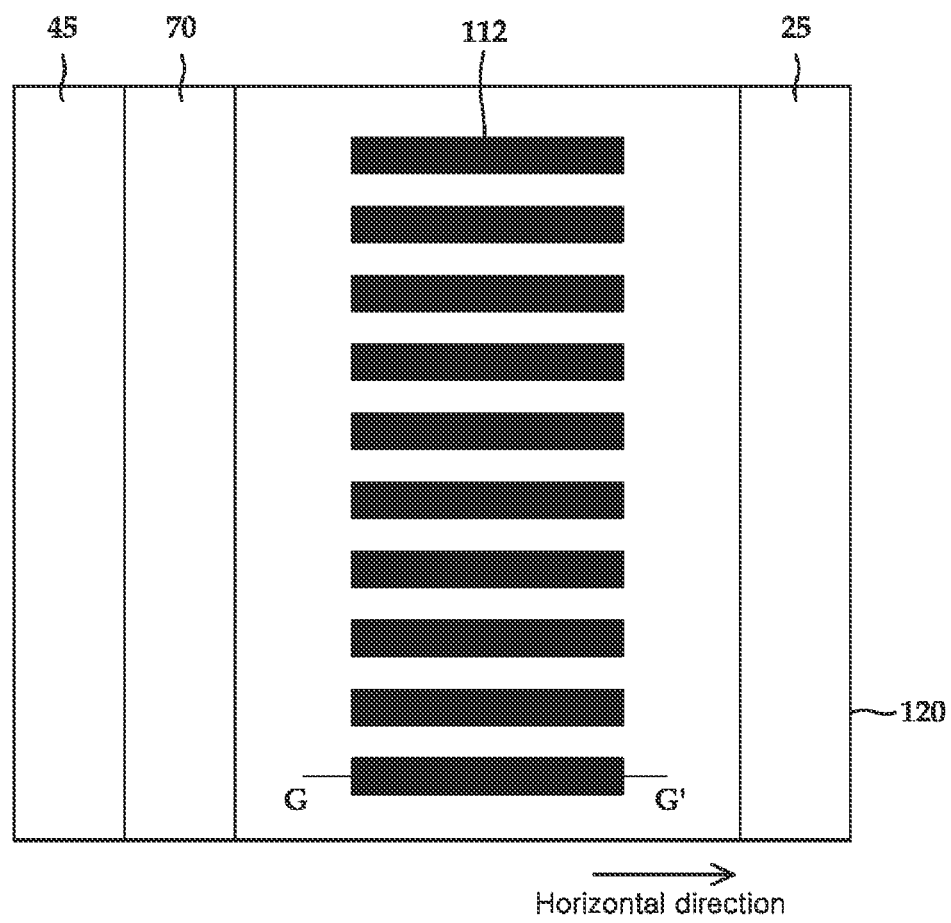

Moreover, as illustrated in FIG. 6D, at a top view, the second stripe pattern 112 is formed as a plurality of line shapes that are isolated from one another in a horizontal direction with respect to the substrate surface. In this case, only one stripe of a second stripe pattern 112 with a wide width is formed along a third cross section (G-G') with regards to the mask pattern 120.

Moreover, as illustrated in FIG. 6E, in a top view, the second stripe pattern 112 can be formed in a circular shape instead of the narrow and long PR stripe pattern. Such a circular pattern 112 is potentially applied with different sizes, separation distances, and number of semiconductor devices applied to designs of examples.

Additionally, various examples are applied as using other ion-injected blocking PR mask patterns 112 that are applied to implement the principles of examples as discussed above.

Likewise, one reason why a second stripe pattern 120 is formed on a mask pattern that is applied on the N-type deep well region "C" for the N-type deep well 20 configuration as discussed, is to reduce charge quantity so as to correspond with an increased charge quantity due to a corresponding configuration of an N-type body region 30. As a whole, an P-N charge quantity is stably maintained thereby, and hence an improvement in breakdown voltage and securing a more stable breakdown voltage becomes possible.

Figure 7:
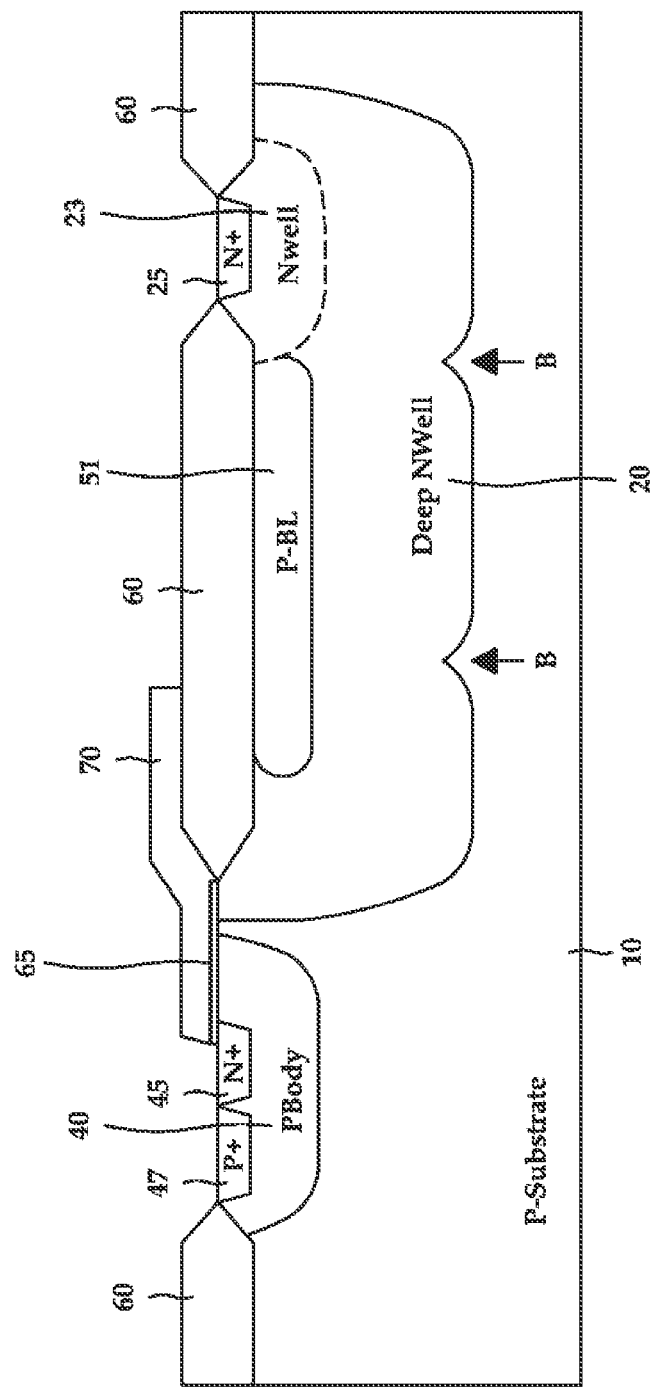
FIG. 7 illustrates a semiconductor device according to another example.

FIG. 7 illustrates a semiconductor substrate according to another example.

In comparison with the example of FIG. 3, a semiconductor structure that is illustrated in the example of FIG. 7 has no N-type body region that surrounds the N-type source region 45 and the P-type body region 40. In other words, it shows the use of a non-isolated nLDMOS structure. Accordingly, semiconductor structure illustrated in FIG. 7 is an example of forming N-type deep well 20 in a non-isolated nLDMOS structure that uses mask patterns 110, 120 with stripe structure formed as illustrated in the examples of FIG. 6 and related techniques. Likewise, the examples apply not only to Quasi-isolated LDMOS but also to non-isolated LDMOS devices.

If a mask process is conducted with a mask pattern 120 that is formed of stripes as is illustrated in FIG. 6, a part of a region among bottom of the N-type deep well 20 is formed in a recessed structure, and as a result has an effect of causing an increase in breakdown voltage value. This is because a depletion region is formed more easily in a Reverse Bias state, corresponding to such an example.

Figure 8:
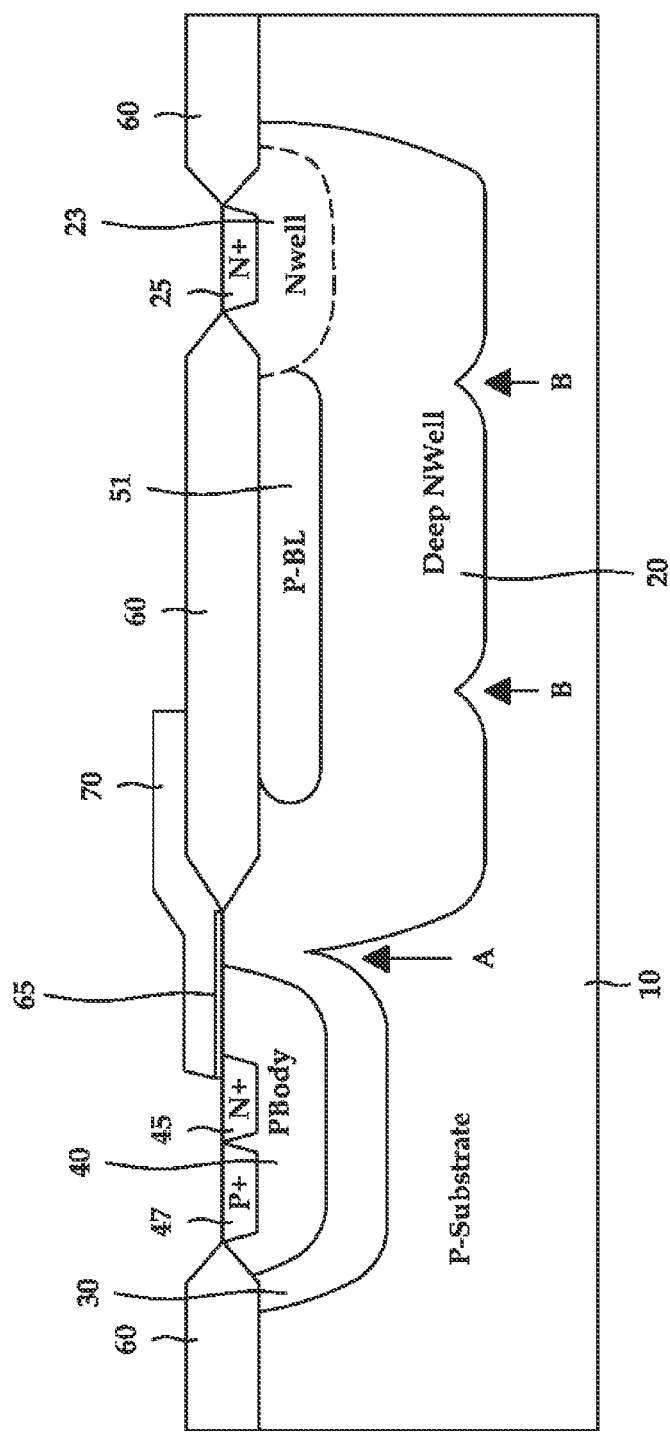
FIG. 8 illustrates a semiconductor device according to another example.

FIG. 8 illustrates a semiconductor device according to another example.

Herein, a semiconductor structure, illustrated in FIG. 8, is manufactured with the N-type body region 30 and the N-type deep well region 20 that are the results of different masks, unlike the example of FIG. 3. Accordingly, the example of FIG. 8 is an example in which the depths of N-type body region 30 and N-type deep well 20 is formed as being different from each other.

As illustrated in FIG. 8, an impurity is ion-injected using mask pattern that is formed having stripes so as to form the N-type deep well 20, and thereby, the N-type deep well 20 has an uneven surface at the bottom.

In a case of the example illustrated in FIG. 8, the example has an issue of an increase in manufacturing cost because at least one more mask process is used compared to the example of FIG. 2. However, in the example illustrated in FIG. 8, achieving an impurity concentration as provided for in examples is potentially achieved by forming the N-type body region 30 and the N-type deep well 20 through using different mask process. Thereby, as illustrated in FIG. 8, the N-type body region 30 and the N-type deep well 20 are formed with different depths.

Additional features of a semiconductor device according to the present examples are recited further compared with alternatives through FIG. 9A to FIG. 11.

Figure 9A:
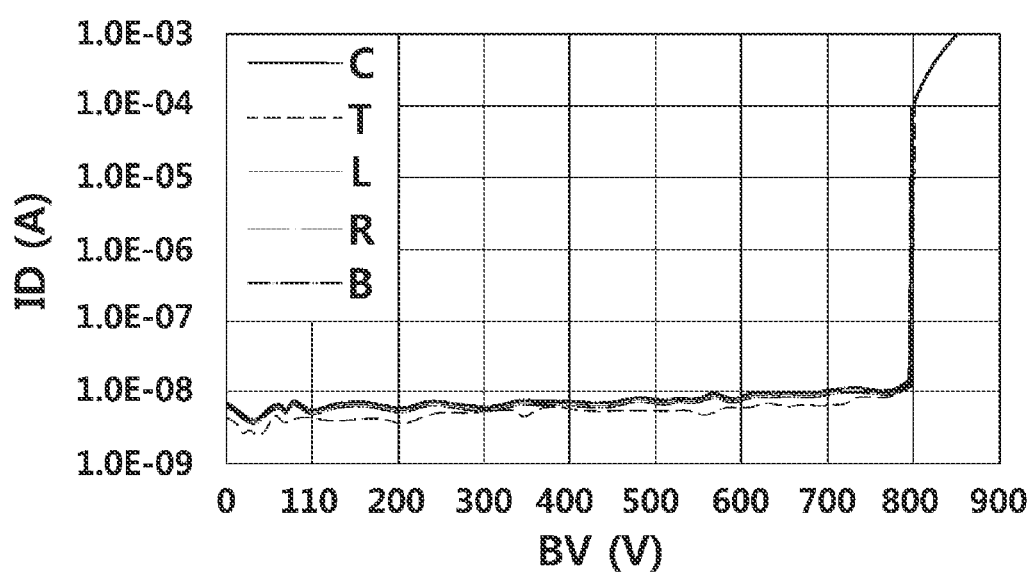
FIGS. 9A and 9B respectively show an illustrated semiconductor structure and a result of features of such a semiconductor device in the example of FIG. 5.
Figure 9B:
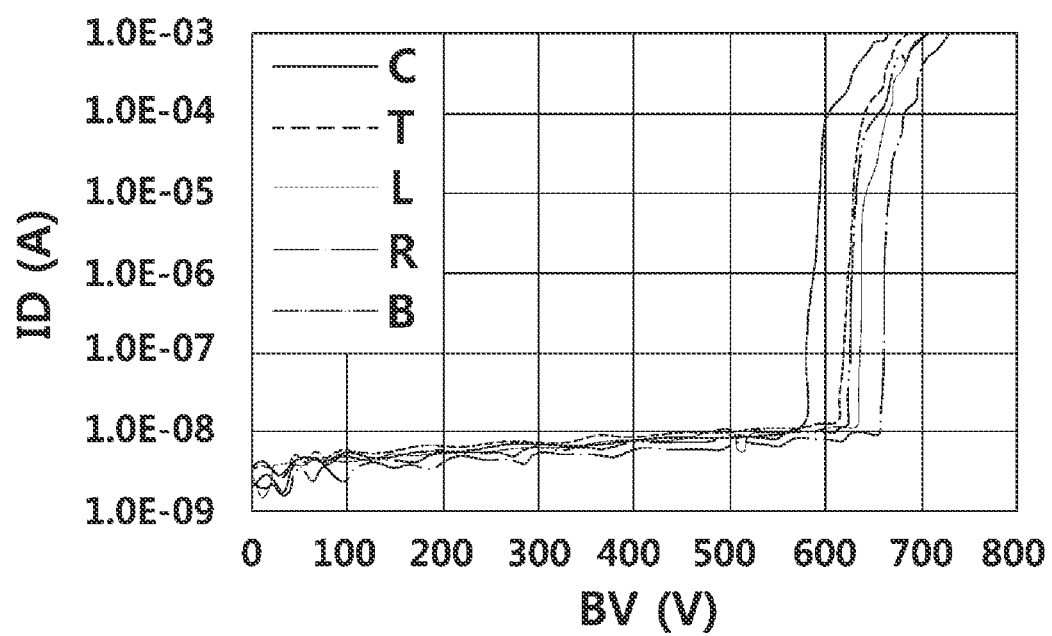

FIG. 9A to FIG. 9B are diagrams illustrating results of features in a semiconductor device as illustrated in the example of FIG. 1 and a semiconductor device of FIG. 5 according to the present examples.

First, in the example of FIG. 9A, a mask pattern with a stripe structure formed in a mask region so as to form the N-type deep well 20 thereof is used in order to form a semiconductor device according to the examples. FIG. 9A also illustrates a graph that shows a drain current or ID value according to $BV_{DSS}$ value with respect to a N-type deep well structure that is formed according to the mask pattern. Regardless of the position of a wafer, distribution of breakdown voltage (BV) value is concentrated at around 800V. LBCTR indicates how left, bottom, center, top, right (LBCTR) positions in one wafer and a representative position in a wafer perform. By comparing BV value according to positions, FIG. 9A shows how BV values are similar in various portions of a wafer.

By contrast, in FIG. 9B, a mask pattern with no stripe structure is formed in a mask region so as to form a N-type deep well and thereby produce a semiconductor structure as illustrated in FIG. 1. Moreover, FIG. 9B illustrates a graph which indicates drain current or ID value according to $BV_{DSS}$ value, voltage between source-drain regions, in regards to a N-type deep well structure that is formed according to the mask pattern.

Referring to FIG. 9B, in the present invention, the distribution of BV value is widely variant from 500 to 700 V. This distribution is caused by unbalanced charge quantity between N-type and P-type.

Figure 10:
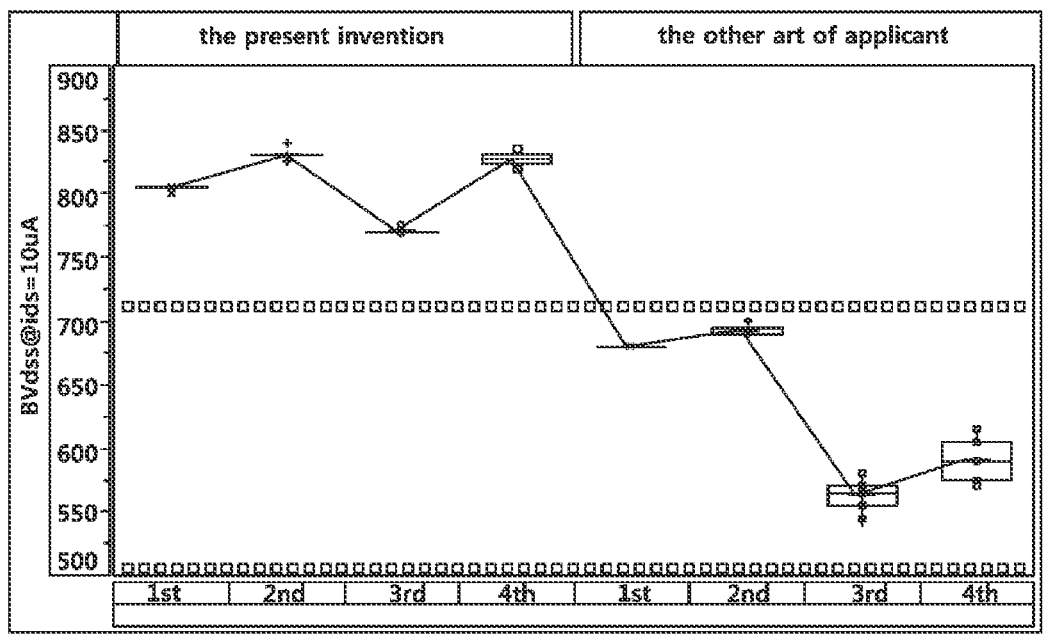
FIG. 10 is a diagram illustrating BV value of a semiconductor structure according to an example and semiconductor structure according to an alternative example.

FIG. 10 is a diagram illustrating breakdown voltage values of a semiconductor structure according to an example and a semiconductor structure according to another example.

As illustrated in FIG. 10, the breakdown voltage value of a semiconductor structure that is manufactured according to a semiconductor manufacture method of the present examples occurs between 700-900 V. Contrariwise, semiconductor structure according to the alternative example of FIG. 1 has a breakdown voltage value under 700 V.

As suggested in the examples, in the case of a semiconductor structure that uses a mask pattern with stripe structure configured so as to form the N-type deep well 20, a breakdown voltage value between 700-900 V is formed. By contrast, in alternatives, a breakdown voltage value under 700 V is formed. When the N-type deep well is formed using a stripe pattern, a charge quantity per unit area of N-type deep well 20 smaller than N-type body region 30, high BV value is obtained. In an identical condition, a $BV_{DSS}$ value is produced as being improved in comparison by up to more than 200 V, according to existence of a stripe pattern in the N-type deep well.

Figure 11:
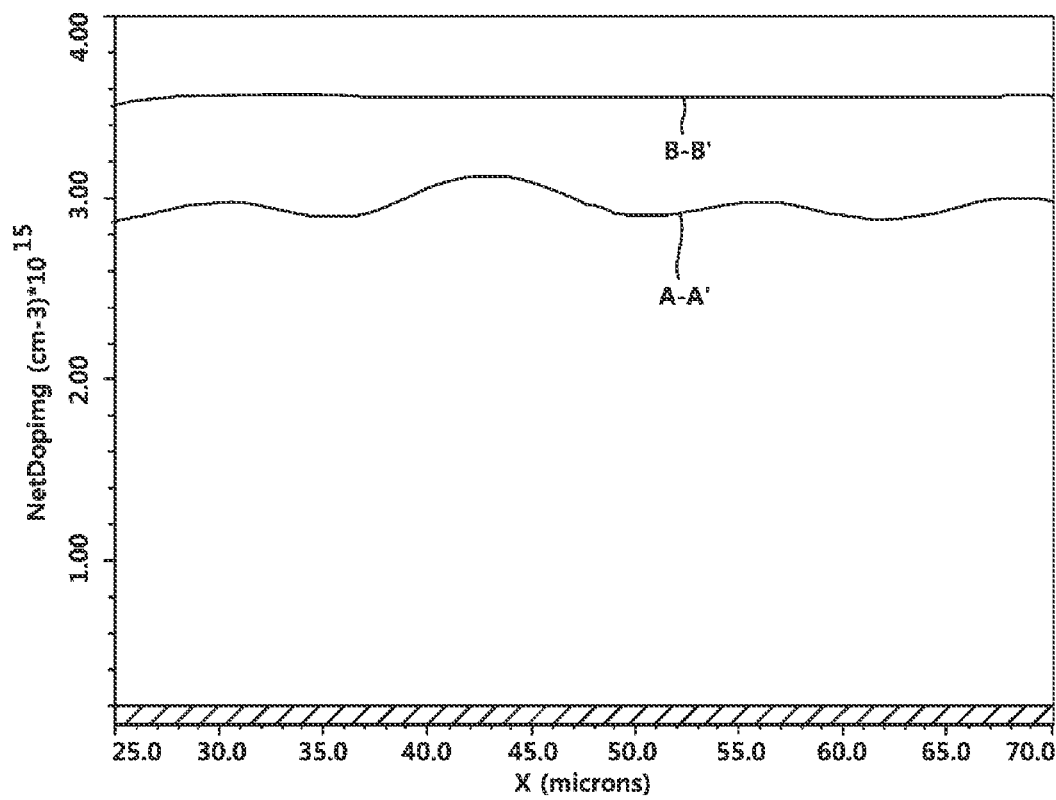
FIG. 11 illustrates N-type doping concentration profiles in the deep well region with and without a stripe pattern.

FIG. 11 illustrates N-type doping concentration profile in the deep well region with or without a stripe pattern. A-A' illustrates a doping profile when the strip pattern is used in the deep well region 20. A-A' shows a non-planar shape in a horizontal direction. On the other hand, B-B' illustrates doping profile when the strip pattern is not used in the deep well region 20. B-B' shows a planar shape in a horizontal direction.

In a case of a stripe pattern used herein, doping concentration is caused to have a value around 3±0.5 E16 atoms/cm³. Contrariwise, B-B' has almost no concentration difference in a horizontal direction. In a case of a stripe pattern used herein, an average concentration is 3E16 atoms/cm³. However, in a case in which a stripe pattern is not used, an average concentration of B-B' line is 3.6E16 atoms/cm³. Difference in doping concentration is within one order of magnitude range. Such a difference implies that doping concentration of N-type deep well 20 of a first semiconductor device 1 does not differ over 1 order of magnitude with doping concentration of N-type deep well region 200 of a second semiconductor device 2. This property also means that a doping concentration of N-type deep well 20 of a first semiconductor device does not differ over one order of magnitude from the doping concentration of N-type body region 30. However, if width Y of a second strip pattern is lengthened, doping concentration possibly differs over 1 order of magnitude.

When a stripe pattern is not used, such as in the semiconductor structure of the example of FIG. 1, a silicon substrate surface has a very high impact ionization rate in a periphery of a source region. As a result, relatively more Electron-Hole Pairs (EHP) are generated by impact ionization on substrate surface. Thus, low voltage breakdown easily occur in a periphery of source region. Hence, $BV_{DSS}$ is degraded.

Thus, it is favorable that doping concentration of the N-type deep well 20 adjacent to the drain region 25 is lower than that of the N-type body region 30 adjacent to source region 45 using stripe pattern in a first semiconductor device. Moreover, a concentration of the N-type deep well region of a first semiconductor device with isolated body region is lower than the N-type deep well region of a second semiconductor device with a non-isolated body region. Thereby, the total N-type doping concentration of a first semiconductor device is almost the same as total N-type doping concentration of a second semiconductor device which does not use a N-type body region. As previously discussed, a stripe pattern blocks ion implantation for the N-type deep well region 20, and thereby it reduces doping concentration in the N-type deep well region 20.

Consequently, a first semiconductor device 1 and a second semiconductor device 2 almost have the same N-type doping concentration. For example, the sum of doping concentrations of the N-type deep well 20 and the N-type body region 30 in the first semiconductor 1 is balanced with the total N-type concentration of N-type deep well 200 in the second semiconductor device 2. Although area of N-type deep well 200 in the second semiconductor has almost the same area with the N-type deep well 20 in the first semiconductor device, the increased N-type dopant concentration caused by the addition of the N-type body region into the first semiconductor device is compensated for by reducing the doping concentration of the N-type deep well region 20 caused by blocking pattern such as the stripe pattern applied, as discussed.

A semiconductor device and method of fabricating the same according to the examples, by using a mask process with a plurality of ion injected blocking structures formed so as to form a second conductivity type deep well region on a first conductivity type substrate, decreases total concentration of impurity and simultaneously forms a concentration of impurity in horizontal direction with respect to substrate surface. Therefore, such an approach has an effect of securing a more stable high breakdown voltage.

Figure 12:
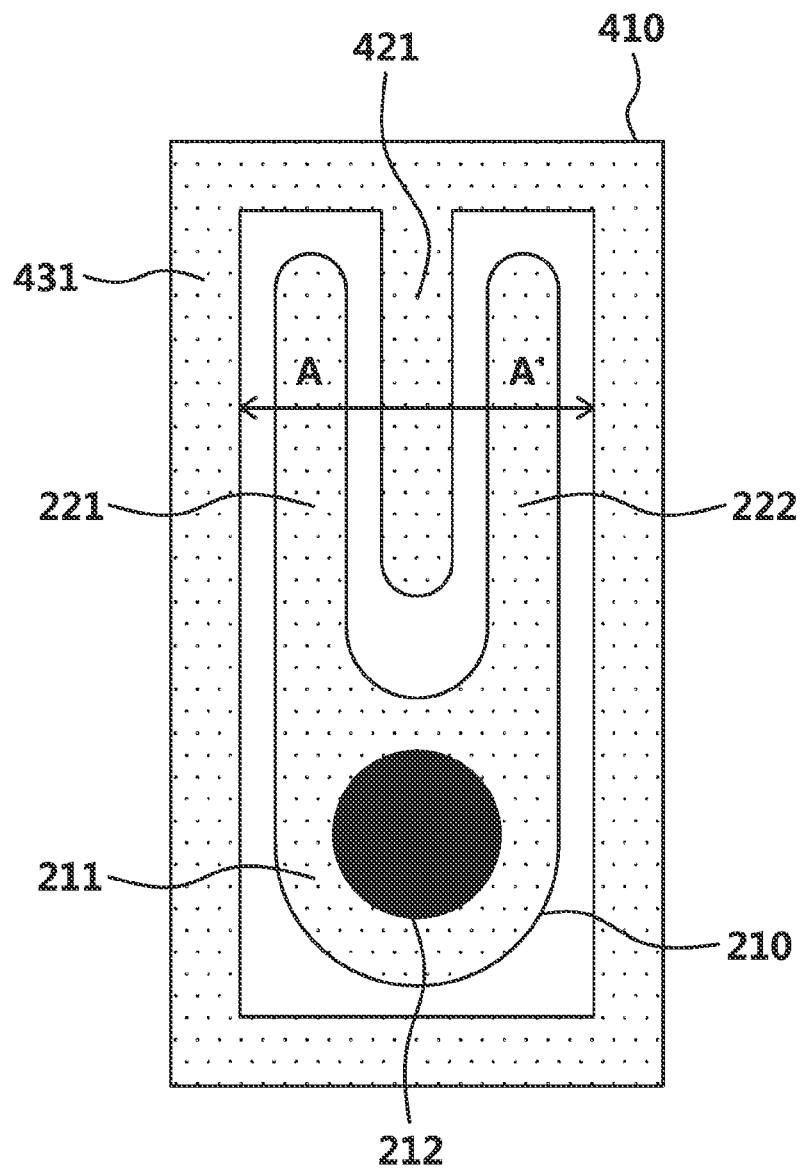
FIG. 12 illustrates a layout of an LDMOS semiconductor device according to an embodiment of the invention.

FIG. 12 illustrates a layout of an LDMOS semiconductor device according to an example.

Figure 13A:
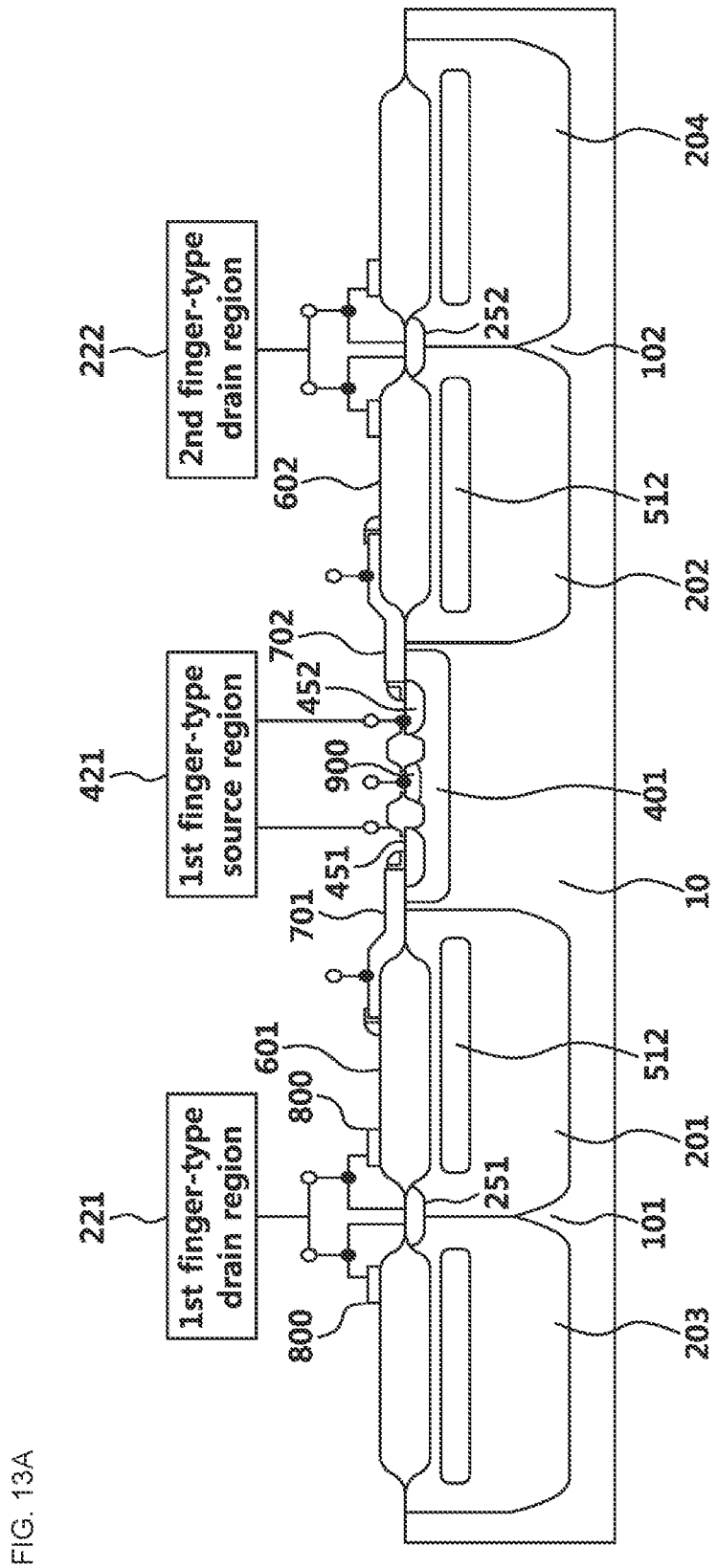
FIG. 13A is a sectional view of a semiconductor device according to an embodiment of the invention taken along line A-A' of FIG. 12.

As illustrated in the example of FIG. 12, a drain metal 210 is formed on a substrate 10 shown in FIG. 13A. The drain metal 210 comprises a body-type drain region 211 and finger-type drain regions 221, 222 formed spaced apart from each other. The body-type drain region 211 and the finger-type drain regions 221, 222 are connected to each other and formed on the same plane. The finger-type drain regions 221, 222 comprise a first finger-type drain region 221 and a second finger-type drain region 222 in the example of FIG. 12. A drain pad 212, which is electrically connected to the drain metal 210, is formed on the body-type drain region 211.

As further illustrated in the example of FIG. 12, a source metal 410 is formed on the substrate 10. The source metal 410 comprises a first finger-type source region 421 formed adjacent to the drain pad 212. The first finger-type source region 421 is formed between the first and second finger-type drain regions 221, 222. In addition, the source metal 410 further comprises a body-type source region 431 formed to completely surround the drain metal 210. The body-type source region 431 and the first finger-type source region 421 are connected to each other and formed on the same plane. FIG. 12 may be regarded as a semiconductor device in a basic unit form according to an example of the present disclosure. Here, examples of the semiconductor device comprise an LDMOS and an EDMOS, which are all high-voltage semiconductor devices that can be driven up to 100 to 1200 V.

FIG. 13A is a cross-sectional view of a semiconductor device, taken along the line A-A' of FIG. 12, according to an example.

As illustrated in the example of FIG. 13A, a highly doped N-type first drain region 251 is formed in the substrate below the first finger-type drain region 221. The first finger-type drain region 221 is electrically connected to the highly doped N-type first drain region 251 through a contact plug or via (not shown). N-type first and third drift regions 201, 203 are formed below the first finger-type drain region 221. The highly doped N-type first drain region 251 is formed between the first and third drift regions 201, 203. In addition, a first dip 101 is formed at a portion between the first and third drift regions 201, 203. Dips are caused by short shielding patterns 130 in a drift mask for forming drift regions 201-204 (FIG. 17), and the short shielding patterns 130 in the drift mask are used for selectively blocking ion implantation when the drift regions 201-204 are formed.

Similarly, a highly doped N-type second drain region 252 is formed in the substrate 10 below the second finger-type drain region 222. The second finger-type drain region 222 is electrically connected to the highly doped N-type second drain region 252 through a contact plug or via (not shown). Second and fourth drift regions 202, 204 are formed below the second finger-type drain region 222. The highly doped second drain region 252 is formed between the second and fourth drift regions 202, 204. In addition, a second dip 102 is formed at a portion between the second and fourth drift regions 202, 204.

The first finger-type source region 421 is formed between the first and second finger-type drain regions 221, 222. A first source region 451, a first pickup region 900, and a second source region 452, which are highly doped regions, are formed below the first finger-type source region 421. Here, the first pickup region 900 is disposed between the first and second source regions 451, 452, and isolation layers are formed between the pickup region 900 and the source regions 451, 452 to electrically separate the respective source regions 451, 452 from the pick up region 900. The first finger-type source region 421 is electrically connected with the first and second source regions 451, 452, respectively. The first finger-type source region 421 is electrically connected to a source voltage. The first pickup region 900 is electrically connected to a ground voltage or a negative bias voltage.

A first body region 401 is formed in the substrate 10 to surround the first source region 451, the second source region 452 and the first pickup region 900. The P-type first body region 401 is formed to overlap a first gate electrode 701 and a second gate electrode 702. Each of overlapping P-type first body region 401 with the first gate electrode 701 and the second gate electrode 702 becomes a first channel region and a second channel region, respectively. A doping concentration of the first pickup region 900 is higher than that of the first body region 401, such that the first pickup region 900 is used to apply a bias to the first body region 401.

Here, the first to fourth drift regions 201-204, the first and second source regions 451, 452, and the first and second drain regions 251, 252 may be formed to have an N-type conductivity type (first conductivity type). In addition, the first pickup region 900 and the first body region 401 may be formed to have a P-type conductivity type (second conductivity type). According to another example, the first to fourth drift regions 201-204, the first and second source regions 451, 452, and the first and second drain regions 251, 252 may be formed to have a P-type conductivity type (second conductivity type), and the first pickup region 900 and the first body region 401 may be formed to have an N-type conductivity type (first conductivity type).

As illustrated in the example of FIG. 13A, P-type buried layers (PBL, 512) are formed in the N-type first to fourth drift regions 201-204. The P-type buried layers (PBL, 512) are formed spaced apart from the field oxide layers 601, 602. The buried layers 512 may be electrically connected to the pickup region 900. Thereby, the buried layers 512 help to easily extend a depletion region in the reverse bias state. The buried layers 512, the pickup region 900, and the body region 401 may be formed to have a same conductivity type (for example, P-type).

The field oxide layers 601, 602 are formed on the drift region 201-204. The field plates 800 are formed on the field oxide layers. The field plates 800 are electrically connected to the drain region 251, 252. The field plates 800 are used to release the electric field in the drift region 251, 252.

Figure 13B:
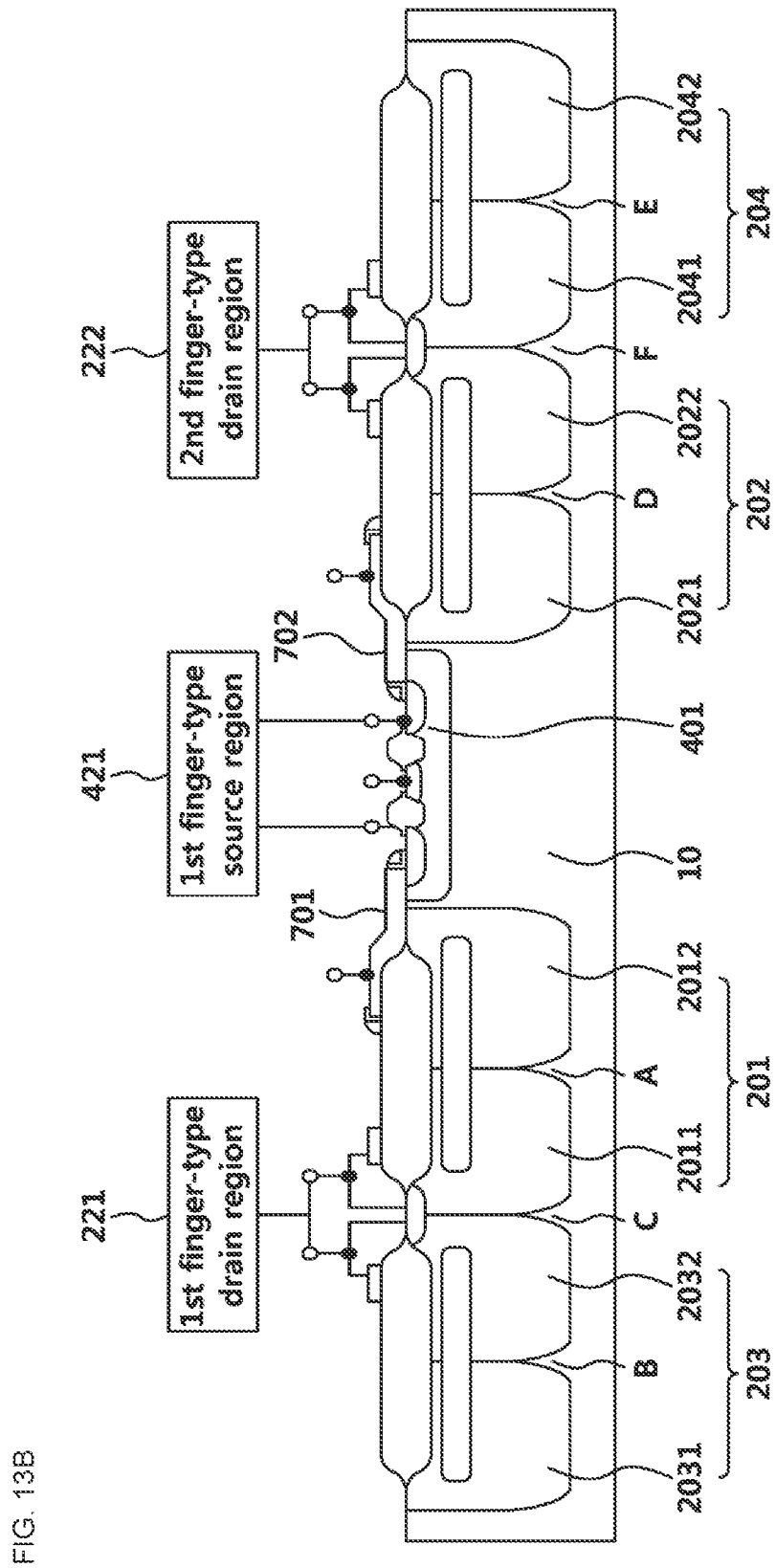
FIG. 13B is a sectional view of a semiconductor device according to another embodiment of the invention taken along line A-A' of FIG. 12.

FIG. 13B is a cross-sectional view of a semiconductor device, taken along the line A-A' of FIG. 12, according to another example.

FIG. 13B is different from FIG. 13A in that dips A-F are formed on the bottom surface of the drift regions 201-204. More curves are formed on the bottom surface of the drift regions 201-204. The dips A-F are caused by the short shielding patterns 130 in a drift mask for forming the drift regions 201-204 (See FIG. 17). The short shielding patterns 130 are used for blocking ion implantation when the drift regions 201-204 are formed. The drift regions 201-204 comprise sub-drift regions 2011, 2012, 2021, 2022, 2031, 2032, 2041 and 2042, each having a same depth. That is, the sub-drift regions 2011-2042 are combined to form one drift region.

For example, the first drift region 201 comprises a first sub-drift region 2011 and a second sub-drift region 2012. In addition, a first sub-dip A is formed between the first sub-drift region 2011 and the second sub-drift region 2012. Similarly, the third drift region 203 comprises a third sub-drift region 2031 and a fourth sub-drift region 2032. In addition, a second sub-dip B is formed between the third sub-drift region 2031 and the fourth sub-drift region 2032. The first dip 101 is shown in FIG. 13A, but the first sub-dip A, second sub-dip B, and third sub-dip C are shown in FIG. 13B. The same is applied for the second and fourth drift regions 202, 204. The second drift region 202 comprises two sub-drift regions 2021, 2022. The fourth drift region 204 comprises two sub-drift regions 2041, 2042. Sub-dips D, E, F are formed between the sub-drift regions 2021, 2022, 2041 and 2042, as illustrated in FIG. 13B.

Figure 14:
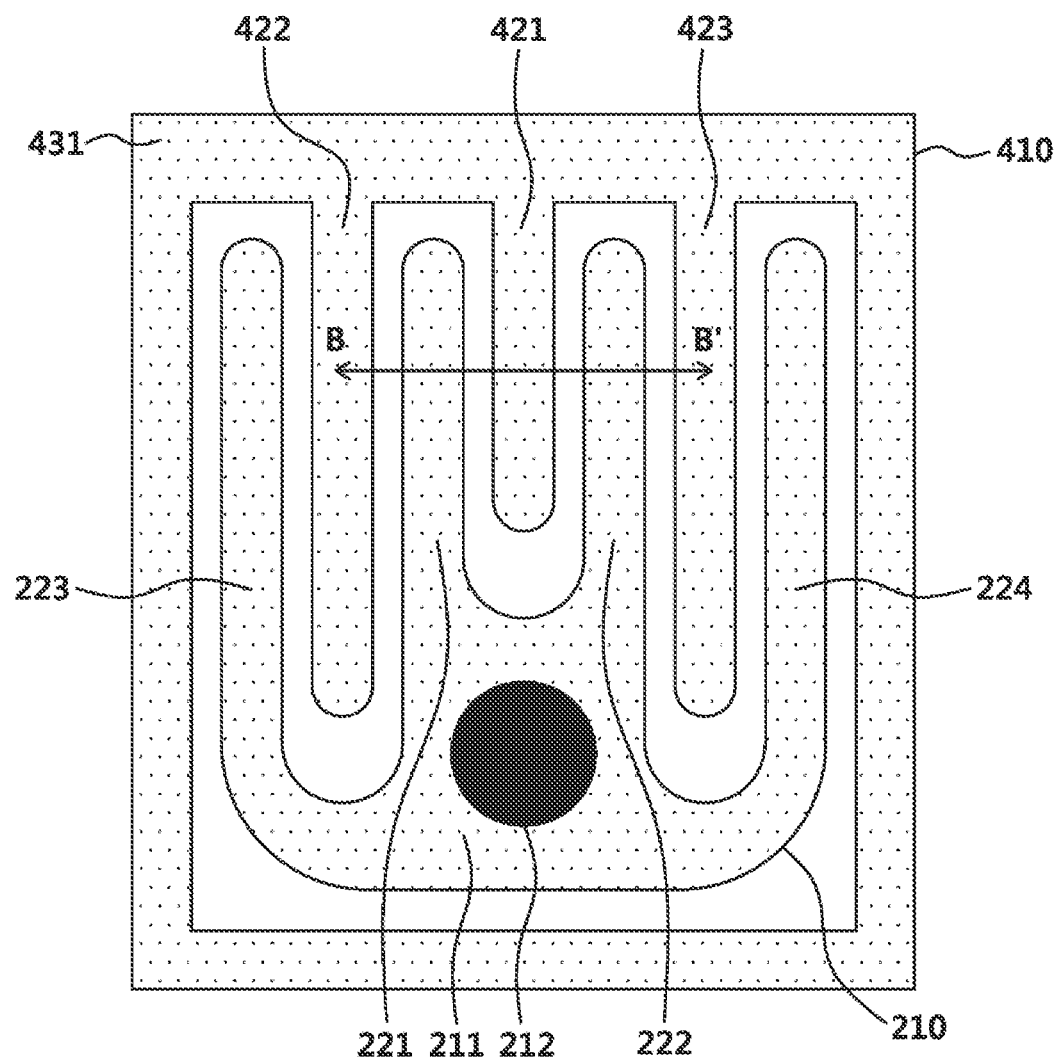
FIG. 14 illustrates a layout of an LDMOS semiconductor device according to another embodiment of the invention.

FIG. 14 illustrates a layout of an LDMOS semiconductor device according to another example.

FIG. 14 illustrates an aspect in which the unit form, LDMOS, illustrated in FIG. 12 is further extended. It may be called an LDMOS array. The area of the semiconductor device may be increased, and thus there is an effect that more currents can flow. Power devices such as UHV devices and BCD power devices are mostly used in an array form to generate a high power.

Figure 15:
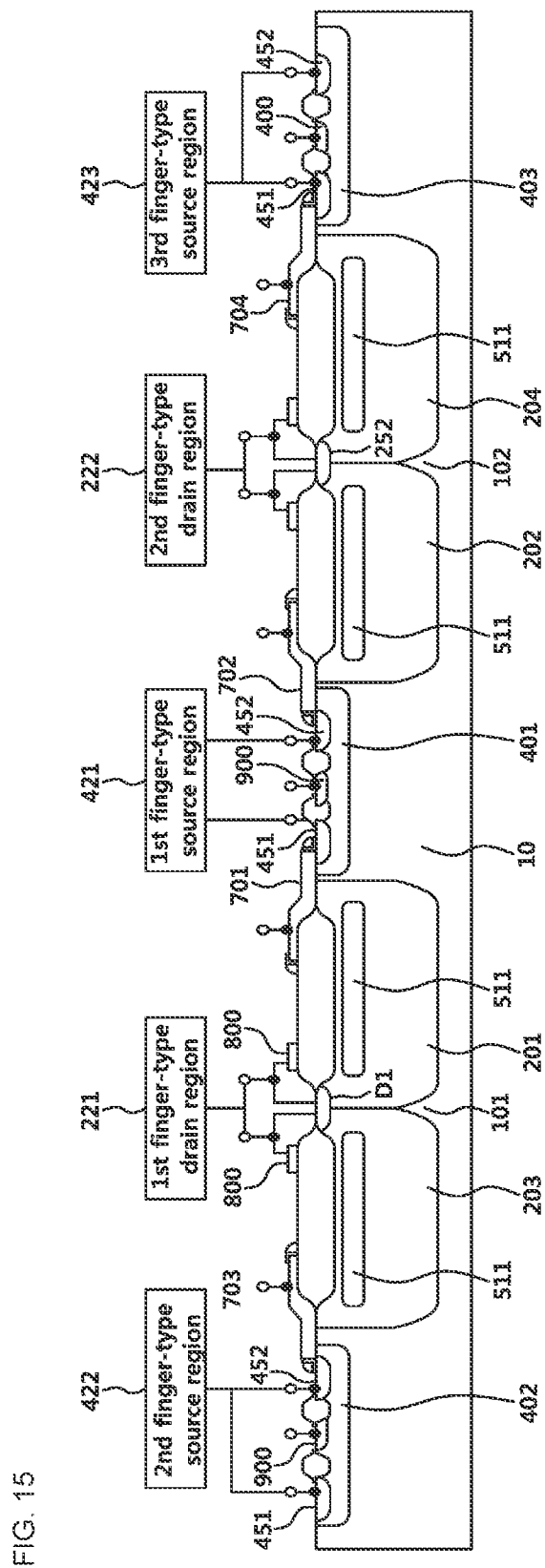
FIG. 15 is a sectional view of a semiconductor device according to an embodiment of the invention taken along line B-B' of FIG. 14.

As illustrated in FIG. 14, a drain metal 210 is formed on a substrate 10 (See FIG. 15). The drain metal 210 comprises a plurality of finger-type drain regions 221-224 which are formed spaced apart from each other. In addition, the drain metal 210 further comprises a body-type drain region 211 connected to the plurality of finger-type drain regions 221-224. A drain pad 212 is formed on the body-type drain region 211.

As illustrated in FIG. 14, the plurality of finger-type drain regions 221-224 comprises first and second finger-type drain regions 221, 222 which have first and second longitudinal lengths and are parallel with each other. The first and second longitudinal lengths are equal to each other.

As illustrated in FIG. 14, the plurality of finger-type drain regions 221-224 further comprises third and fourth finger-type drain regions 223, 224. The third finger-type drain region 223 is formed beside the first finger-type drain region 221, has a third longitudinal length, and is disposed in parallel with the first finger-type drain region 221. A fourth finger-type drain region 224 is formed beside the second finger-type drain region 222, has a fourth longitudinal length, and is disposed in parallel with the first, second, or third finger-type drain region. The third and fourth longitudinal lengths 223, 224 are longer than the first and second longitudinal lengths 221, 222. This is because the drain pad 212 is formed adjacent to the first and second finger-type drain regions 221, 222. The end portion of each of the finger-type drain regions is formed in an oval or circular shape. This is because the circular shape rather than a rectangular shape is helpful in the electric field relaxation. Here, the longitudinal length refers to the length of a straight line except the circular- or oval-shaped end portion.

A source metal 410 is formed on the substrate 10 (See FIG. 15). The source metal 410 comprises a plurality of finger-type source regions 421-423 which are formed spaced apart from each other. The source metal 410 further comprises a body-type source region 431 which is connected to the plurality of finger-type source regions 421-423.

Here, the plurality of finger-type drain regions 221-224 and the plurality of finger-type source regions 421-423 are alternately formed. Alternately forming the plurality of finger-type source regions 421-423 and the plurality of finger-type drain regions 221-224 helps for forming compact semiconductor device and flowing more currents.

The plurality of finger-type source regions 421-423 comprise a first finger-type source region 421 corresponding to the drain pad 212 and having a first longitudinal length. The plurality of finger-type source region 421-423 further comprise second and third finger-type source regions 422, 423 which are disposed symmetrically with respect to the first finger-type source region 421, have a second longitudinal length and a third longitudinal length, respectively, and are disposed parallel with the first finger-type source region 421. The first longitudinal length is shorter than the second longitudinal length and the third longitudinal length, and the second and third longitudinal lengths are equal to each other.

FIG. 15 is a cross-sectional view of a semiconductor device, taken along the line B-B' of FIG. 14, according to an example.

The cross-sectional view of FIG. 15 is similar to that of FIG. 13A. A repeating pattern is added. Unlike FIG. 13A, a second and third finger-type source regions 422, 423, third and fourth gate electrodes 703, 704, and second and third body regions 402, 403 are further formed in FIG. 15. Similar to FIG. 13A, a plurality of dips 101, 102 are formed between the drift regions 201-204 as shown in FIG. 15.

Figure 16A:
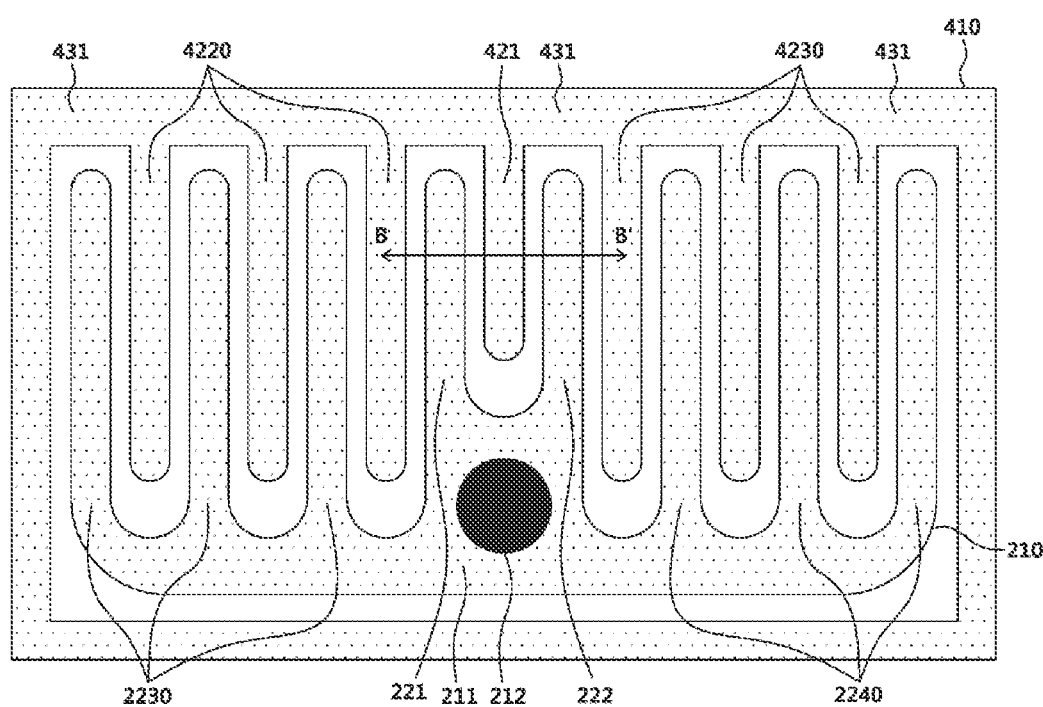
FIGS. 16A and 16B illustrate layouts of an LDMOS semiconductor device according to another embodiment of the invention.
Figure 16B:
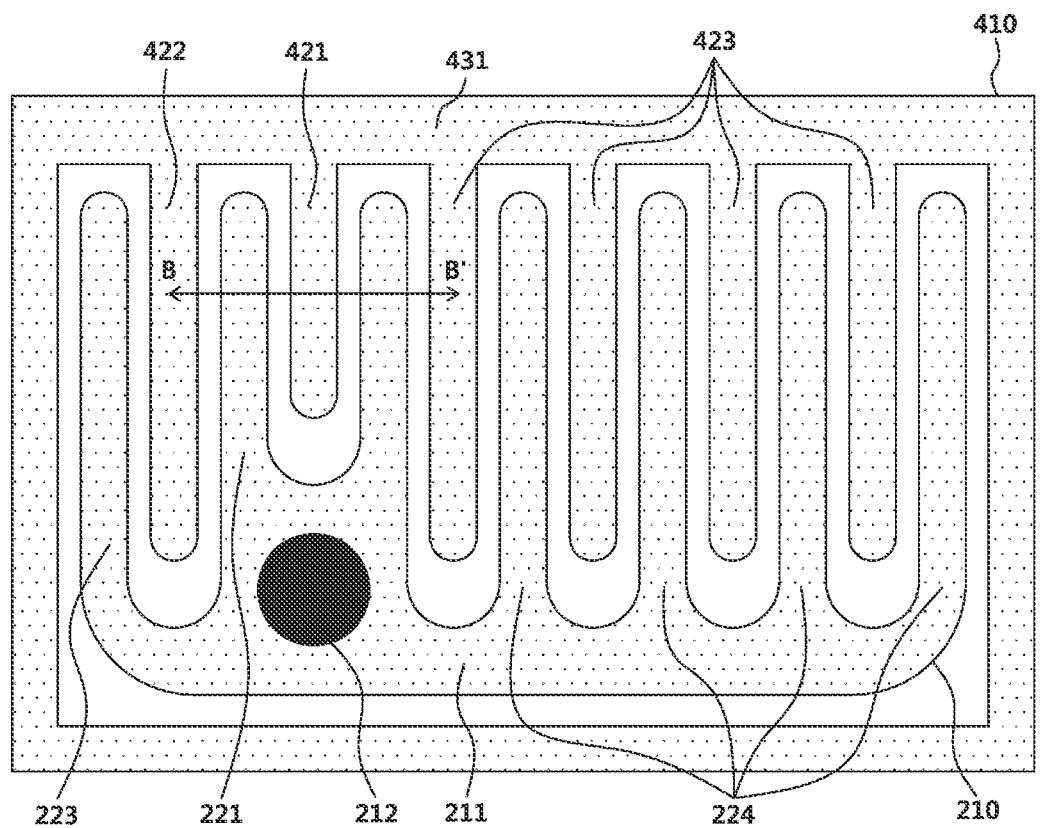

FIGS. 16A and 16B illustrate layouts of an LDMOS semiconductor device according to another example.

FIG. 16A illustrates an aspect in which the unit form, LDMOS, illustrated in FIG. 12 is further extended. Further, the number and the area of the LDMOS arrays are increased more than those in FIG. 14, which is designed to cause more currents to flow.

As illustrated in FIG. 16A, a finger-type source region comprises a first finger-type source region 421, a second group finger-type source region 4220, and a third group finger-type source region 4230. In the second and third group finger-type source regions 4220, 4230, the number of fingers may be increased according to the amount of required currents. Further, a finger-type drain region comprises first and second finger-type drain regions 221, 222, and third and fourth group finger-type drain regions 2230, 2240. Similarly, in the third and fourth group finger-type drain regions 2230, 2240, the number of fingers may be further increased according to the amount of required currents. The finger-type drain regions and the finger-type source regions are alternately formed. All the finger-type source regions are electrically connected to the body-type source region 431. All the finger-type drain regions are electrically connected to the body-type drain region 211. They are formed on the same plane. Each end portion of the finger-type drain region or finger-type source region has a shape of an oval or circular type. This is because the circular type, rather than a rectangular type, helps to relax the electric field.

Each of the second and third group finger-type source regions 4220, 4230 has the same longitudinal length as each other. Similarly, each of the third and fourth group finger-type drain regions 2230, 2240 has the same longitudinal length as each other. However, the first finger-type source region 421, the first finger-type drain region 221, and the second finger-type drain region 222 which are formed near the drain pad 212 are formed to be shorter than other finger-type source/drain regions.

In FIG. 16A, the drain pad 212 is formed in the center of the LDMOS array. On the other hand, in FIG. 16B, the drain pad 212 is formed to be close to one side. The location of the drain pad can be changed to minimize the chip size or the layout size of the LDMOS array.

Figure 17:
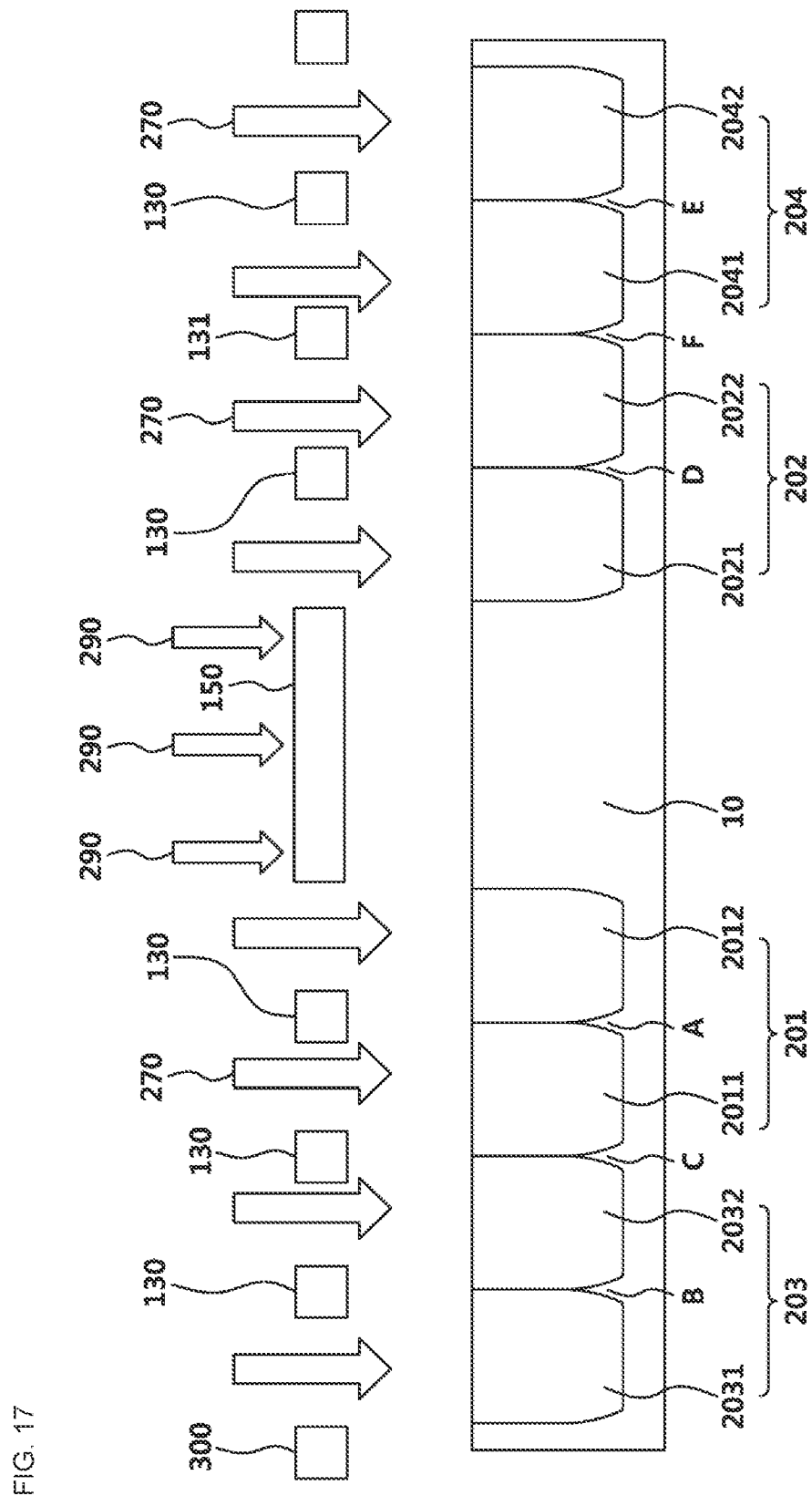
FIGS. 17 to 19 illustrate a method of manufacturing an LDMOS semiconductor device according to an embodiment of the invention.
Figure 18:
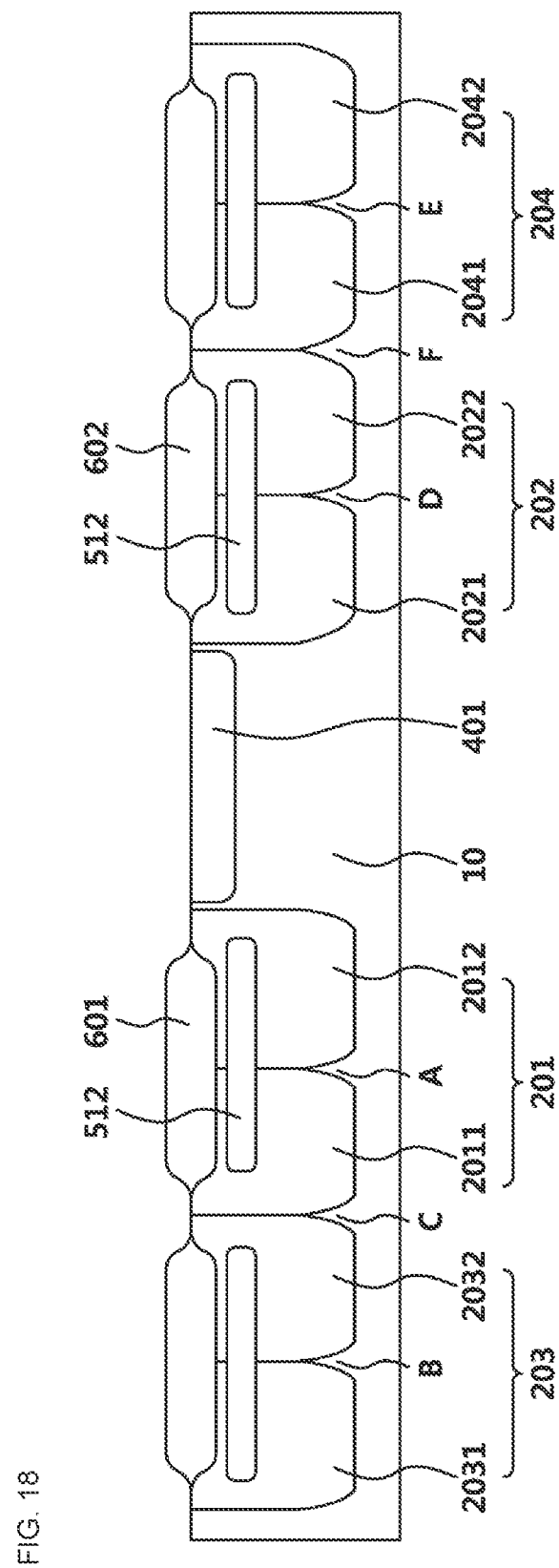
Figure 19:
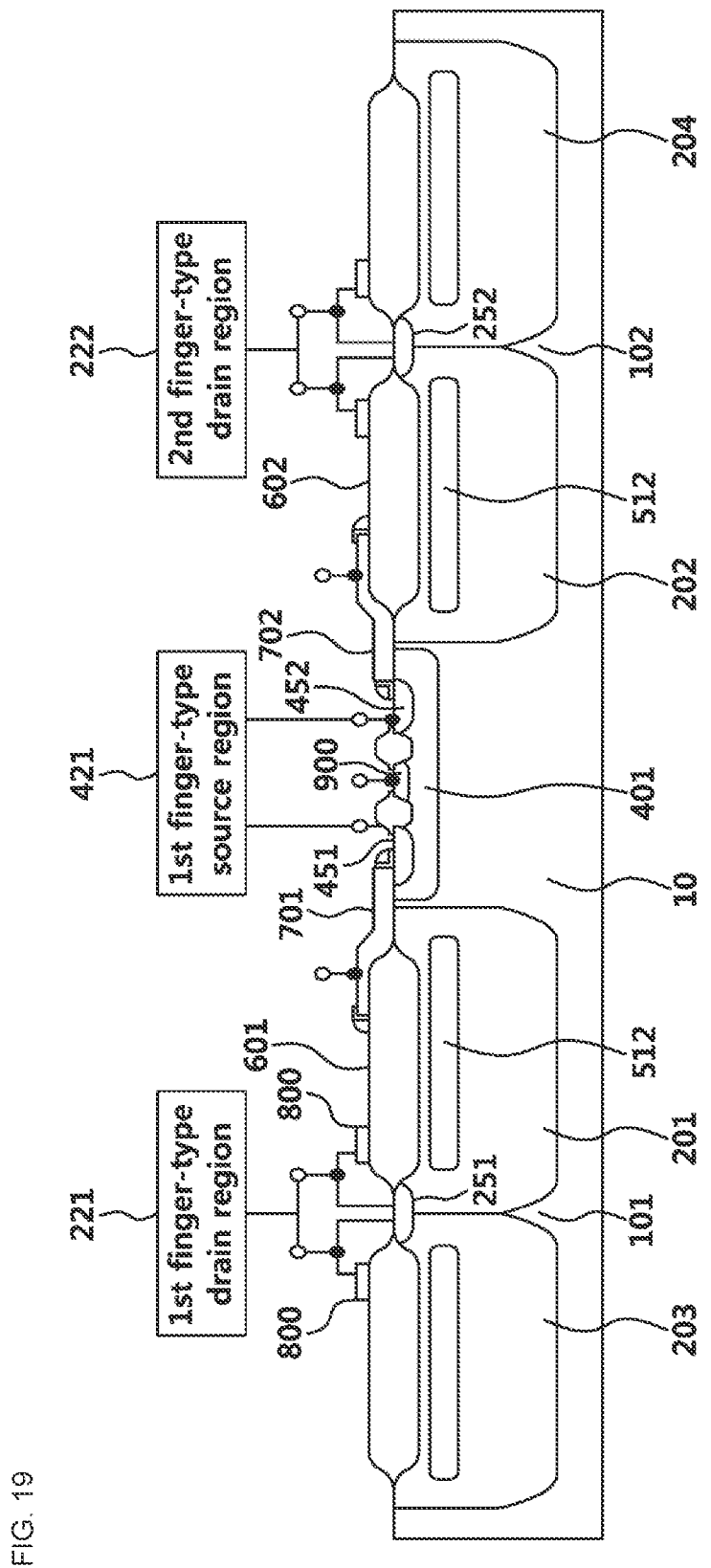

FIGS. 17 to 19 illustrate a method of manufacturing an LDMOS semiconductor device according to an example.

A drift mask comprising a pattern 300 is used in order to form the drift region 201-204 on the substrate 10 as illustrated in FIG. 17. The drift regions 201-204 are formed by an ion implantation process 270, 290. The drift mask comprising the pattern 300 comprises a plurality of short shielding patterns 130 having an equal width to each other. The drift mask comprising the pattern 300 further comprises a long shield pattern 150. The long shield pattern 150 is formed on the center region and located between the short shielding patterns 130. The short shielding patterns 130 are used for blocking ion implantation 270, 290 when the drift regions 201-204 are formed. Thus, the plurality of dips A-F are caused by the short shielding patterns 130 in the drift mask comprising the pattern 300 for forming the drift regions 201-204. Each of the drift regions 201-204 comprises a plurality of sub-drift regions having an equal depth to each other. After ion implantation process 270, 290, a drive-in annealing process for the dopant diffusion is carried out at a temperature of 900-1100° C. The dose amount of ion implantation into the substrate 10 is decreased due to the shielding patterns 130 so that the drift regions have low dopants concentration compared to ion implantation process without the shielding patterns 130. Thus, a low concentration drift region is formed. The concentration of the drift region is lower than that of the source or drain region. Further, the concentration of the drift region 201-204 is lower than that of the P-type buried layer or P-type body region.

In general, designing the concentration of the drift region is based on a single array in the semiconductor device. That is, a dopant concentration of the N-type drift region is optimized to satisfy the breakdown voltage between the drain region and the source region in the single array. However, when the multi-LDMOS arrays are applied to the semiconductor device, the area of the N-type drift region is relatively increased in the semiconductor device. Such that a total N-type dopant concentration is relatively larger than a total P-type dopant concentration due to the increased area of the N-type drift region. In such a case, a breakdown voltage (BV) may decrease in the semiconductor device due to collapsing the equilibrium dopant concentration between the N-type and P-type dopants. In order to prevent such a phenomenon, the concentration of the drift region is controlled not to increase to a certain level. Thereby, the shielding patterns are required to control the dopants concentration of the N-type drift region in the semiconductor device preserving the high BV.

As illustrated in FIG. 18, the field oxide layers 601, 602 are formed and then, the P-type buried layers (PBL) 512 are formed under the field oxide layers 601, 602. The P-type buried layers (PBL) 512 are formed spaced apart from the field oxide layers 601, 602. When the P-type buried layers (PBL) 512 are formed after the field oxide layer is formed, an effect of reducing damage to the substrate 10 is obtained. This is because the substrate may be damaged if there is no insulation layer on the substrate when the ion implantations are performed to form the PBL. Since the field oxide layer is formed at a high temperature, the dopant diffusion may occur. Thus, it is desirable to form the field oxide layer before the formation of the P-type buried layer.

Then, the P-type body region 401 is formed using a body mask (not shown). The P-type body region 401 is formed between the drift region 201 and the drift region 202.

As illustrated in FIG. 19, gate electrodes 701, 702 and field plates 800 are simultaneously formed on the field oxide layers 601, 602 which function as a gate oxide. Polysilicon is used for forming the gate electrodes 701, 702 and field plates 800. Accordingly, the field plate 800 and the gate electrodes 701, 702 are made by the same poly-Si material.

After the gate electrodes 701, 702 are formed, lightly doped drain (LDD) regions are formed, and spacers are formed on sidewalls of the gate electrodes. After the spacers are formed, N-type high concentration (N+) source/drain regions are formed. Then, the pickup region and P-type high concentration (P+) doping region are formed. Thereafter, a silicide process is carried out to form silicide layers on the source/drain regions 451, 452, 251, 252 and the gate electrodes 701, 702. A non-salicide process may be carried before the silicide layers are formed. The non-salicide process is a process to prevent the silicide layer from being formed in some regions. A first interlayer insulation layer is deposited, a contact plug is formed by etching the first interlayer insulation layer, and a first metal layer (metal 1) is formed on the contact plug. A part of the first metal layer is electrically connected to the P-type pickup region. Thereafter, the second interlayer insulation layer is deposited on the first metal layer, a VIA is formed by etching the second interlayer insulation layer, and then the VIA is filled with tungsten (W) or copper (Cu). A source metal and a drain metal are formed on the VIA. The source metal and the drain metal, such as Cu or aluminum (Al), are electrically connected to the highly doped source region and the highly doped drain region, respectively. The source metal and the drain metal are formed at a level of metal 2, and thus are formed in a layer different from the first metal layer at the level of metal 1.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
    an N-type deep well region and a P-type body region formed in a P-type substrate, the N-type deep well region having a depth greater than a depth of the P-type body region;
    a gate electrode formed on the P-type substrate and overlapping the N-type deep well region and the P-type body region;
    a source region formed in the P-type body region;
    a drain region formed in the N-type deep well region and spaced apart from the gate electrode;
    an N-type body region surrounding the P-type body region and abutting the N-type deep well region; and
    a first dip formed between the N-type body region and the N-type deep well region,
    wherein a lowermost surface of the N-type body region directly contacts the P-type substrate and has a depth smaller than a depth of the N-type deep well region based on an upper surface of the P-type substrate.

2. The semiconductor device of claim 1, wherein the N-type deep well region has a doping concentration smaller than that of the N-type body region.

3. The semiconductor device of claim 1, wherein the P-type body region has a depth less than a depth of the N-type deep well region and a depth of the N-type body region.

4. The semiconductor device of claim 1, wherein the first dip overlaps the gate electrode.

5. The semiconductor device of claim 1, further comprising a pinch-off region in the P-type substrate located between the N-type deep well region and the N-type body region.

6. The semiconductor device of claim 1, wherein the N-type deep well region has an uneven bottom surface and has a non-planar doping profile in a horizontal direction.

7. A semiconductor device comprising:
    an N-type deep well region and a P-type body region formed in a substrate, the N-type deep well region having a depth greater than a depth of the P-type body region;
    a gate electrode formed on the substrate and overlapping the N-type deep well region and the P-type body region;
    a source region formed in the P-type body region;
    a drain region formed in the N-type deep well region and spaced apart from the gate electrode;
    an N-type body region surrounding the P-type body region and abutting the N-type deep well region;
    a first dip formed between the N-type body region and the N-type deep well region; and
    a second dip formed on a bottom surface of the N-type deep well region and located further away from an upper surface of the substrate relative to the first dip,
    wherein the N-type body region has a depth smaller than a depth of the N-type deep well region based on the upper surface of the substrate.

8. The semiconductor device of claim 7, further comprising:
    a field oxide layer disposed between the gate electrode and the drain region; and
    a P-type buried layer disposed under the field oxide layer.

9. The semiconductor device of claim 8, further comprising an N-type well region formed in the N-type deep well region and surrounding the drain region,
    wherein the N-type well region is in contact with the P-type buried layer.

10. The semiconductor device of claim 8, wherein the second dip overlaps the field oxide layer and the P-type buried layer.

11. A semiconductor device comprising:
    an N-type deep well region and a P-type body region formed in a P-type substrate, the N-type deep well region having a depth greater than a depth of the P-type body region;
    a gate electrode formed on the P-type substrate and overlapping the N-type deep well region and the P-type body region;
    a pick-up region and a source region respectively formed in the P-type body region;
    a drain region formed in the N-type deep well region and spaced apart from the gate electrode;
    an N-type body region surrounding the P-type body region and abutting the N-type deep well region; and
    an N-type well region formed in the N-type deep well region and surrounding the drain region,
    wherein a lowermost surface of the N-type body region directly contacts the P-type substrate and has a depth smaller than a depth of the N-type deep well region based on an upper surface of the P-type substrate.

12. The semiconductor device of claim 11, further comprising a first dip formed between the N-type body region and the N-type deep well region,
    wherein the first dip overlaps the gate electrode.

13. The semiconductor device of claim 11, wherein the N-type deep well region has a doping concentration smaller than that of the N-type body region.

14. The semiconductor device of claim 12, further comprising a second dip formed on a bottom surface of the N-type deep well region,
   wherein the second dip is located further away from an upper surface of the P-type substrate relative to the first dip.

15. The semiconductor device of claim 14, further comprising:
   a field oxide layer disposed between the gate electrode and the drain region; and
   a P-type buried layer disposed under the field oxide layer and abutting the N-type well region.

16. The semiconductor device of claim 15, wherein the second dip overlaps the field oxide layer and the P-type buried layer.

17. The semiconductor device of claim 11, wherein the P-type body region has a depth less than a depth of the N-type deep well region and a depth of the N-type body region.

18. The semiconductor device of claim 11, wherein the N-type deep well region has an uneven bottom surface and has a non-planar doping profile in a horizontal direction.

* * * * *